United States Patent
Srinivasan et al.

(10) Patent No.: US 11,501,097 B2
(45) Date of Patent: Nov. 15, 2022

(54) BARCODED END FACET PRINTED PHOTONIC CHIP AND BARCODE-GUIDED DIRECT LASER WRITING

(71) Applicant: Government of the United States of America, as represented by the Secretary of Commerce, Gaithersburg, MD (US)

(72) Inventors: Kartik Arvind Srinivasan, Rockville, MD (US); Edgar F. Perez, College Park, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 0 days.

(21) Appl. No.: 17/476,020

(22) Filed: Sep. 15, 2021

(65) Prior Publication Data
US 2022/0083755 A1   Mar. 17, 2022

Related U.S. Application Data

(60) Provisional application No. 63/078,550, filed on Sep. 15, 2020.

(51) Int. Cl.
*G06K 7/14* (2006.01)
*G06K 7/10* (2006.01)

(52) U.S. Cl.
CPC ....... *G06K 7/1408* (2013.01); *G06K 7/10742* (2013.01)

(58) Field of Classification Search
CPC .................. G06K 7/1408; G06K 7/10742
See application file for complete search history.

(56) References Cited

U.S. PATENT DOCUMENTS 5,018,813 A * 5/1991 Roddy ................ H04N 1/1911
                                                              385/16
9,933,574 B1 * 4/2018 Zhang ................ G02B 6/4239

OTHER PUBLICATIONS

Billah, M.R., et al., "Hybrid integration of silicon photonics circuits and InP lasers by photonic wire bonding", Optica, 2018, p. 876-883, vol. 5 No. 7.
Dietrich, P-I, et al., "In situ 3D nanoprinting of free-form coupling elements for hybrid photonic integration", Nature Photonics, 2018, p. 241-247, vol. 12.

(Continued)

*Primary Examiner* — Jamara A Franklin
(74) *Attorney, Agent, or Firm* — Office of Chief Counsel for National Institute of Standards and Technology

(57) ABSTRACT

A barcoded end facet printed photonic chip includes: an optically transparent direct laser writing substrate including a transverse waveguide writing surface to receive a direct write laser light for off-axis direct write laser printing and a facet surface to receive the direct write laser light for on-axis direct write laser printing of a barcode-guided direct laser written optical coupling on the facet surface; a waveguide disposed in the optically transparent direct laser writing substrate and in optical communication with the facet surface; and an optically visible bulk impregnated barcode disposed in the optically transparent direct laser writing substrate arranged proximate to the waveguide and in optical communication with the facet surface.

20 Claims, 16 Drawing Sheets

(56) References Cited

OTHER PUBLICATIONS

Thomas, R., et al., "In situ fabricated 3D micro-lenses for photonic integrated circuits", Optics Express, 2018, p. 13436-13642, vol. 26 No. 10.

Bogucki, A., et al., "Optical fiber micro-connector with nanometer positioning precision for rapid prototyping of photonic devices", Optics Express, 2018, p. 11513-11518, vol. 26 No. 9.

* cited by examiner (d)

| Method | TE | | TM | |
|---|---|---|---|---|
| | $D_{1dB}$ | $D_{3dB}$ | $D_{1dB}$ | $D_{3dB}$ |
| Micro Optic | (9.76 ± 0.74) μm | (16.93 ± 1.30) μm | (10.00 ± 0.89) μm | (17.34 ± 1.55) μm |
| Cleaved Fiber | (4.19 ± 0.11) μm | (7.28 ± 0.19) μm | (4.02 ± 0.32) μm | (6.97 ± 0.55) μm |
| Lensed Fiber | (2.23 ± 0.14) μm | (3.87 ± 0.23) μm | (2.31 ± 0.08) μm | (4.01 ± 0.14) μm |

FIG. 14

BARCODED END FACET PRINTED PHOTONIC CHIP AND BARCODE-GUIDED DIRECT LASER WRITING

CROSS REFERENCE TO RELATED APPLICATIONS

This application claims the benefit of U.S. Provisional Patent Application Ser. No. 63/078,550 (filed Sep. 15, 2020), which is herein incorporated by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in this invention.

BRIEF DESCRIPTION

Disclosed is a barcoded end facet printed photonic chip comprising: an optically transparent direct laser writing substrate comprising a transverse waveguide writing surface to receive a direct write laser light for off-axis direct write laser printing and a facet surface to receive the direct write laser light for on-axis direct write laser printing of a barcode-guided direct laser written optical coupling on the facet surface; a waveguide disposed in the optically transparent direct laser writing substrate and in optical communication with the facet surface; and an optically visible bulk impregnated barcode disposed in the optically transparent direct laser writing substrate arranged proximate to the waveguide and in optical communication with the facet surface.

Disclosed is a barcode-guided direct laser writer for barcode-guided direct laser writing of an optically transparent direct laser writing substrate, the barcode-guided direct laser writer comprising: a translation stage that receives an optically transparent direct laser writing substrate in an off-axis printing orientation or an on-axis printing orientation with respect to a direct write laser; a direct write laser in optical communication with the optically transparent direct laser writing substrate and that produces direct write laser light; an optical objective in optical communication with the optically transparent direct laser writing substrate and that receives an image of the optically transparent direct laser writing substrate; a light sensor in optical communication with the optically transparent direct laser writing substrate via the optical objective and that receives the image from the optical objective and produces image data from the image; an analyzer in electrical communication with the direct write laser, the light sensor, and the translation stage and that: controls the direct write laser so that the direct write laser produces the direct write laser light under the control of the analyzer; receives the image data from the light sensor and controls the direct write laser and the translation stage based on the image data; determines a position of a waveguide in the optically transparent direct laser writing substrate relative to an optically visible bulk impregnated barcode disposed in the optically transparent direct laser writing substrate; and controls the translation stage so that the translation stage positions the optically transparent direct laser writing substrate relative to the direct write laser under control of the analyzer to make a barcode-guided direct laser written optical coupling on a facet surface of the optically transparent direct laser writing substrate to form a barcoded end facet printed photonic chip from the optically transparent direct laser writing substrate via barcode-guided direct laser writing, wherein the optically transparent direct laser writing substrate forms a barcode-guided direct laser written optical coupling in response to receipt of the direct write laser light from the direct write laser at the facet surface, and the optically transparent direct laser writing substrate comprises: a transverse waveguide writing surface that receives the direct write laser light when disposed on the translation stage for off-axis direct write laser printing and the facet surface that receives the direct write laser light when disposed on the translation stage for on-axis direct write laser printing of the barcode-guided direct laser written optical coupling on the facet surface; a waveguide disposed in the optically transparent direct laser writing substrate and in optical communication with the facet surface; and the optically visible bulk impregnated barcode disposed in the optically transparent direct laser writing substrate arranged proximate to the waveguide and in optical communication with the facet surface.

Disclosed is a process for barcode-guided direct laser writing of an optically transparent direct laser writing substrate, the process comprising: receiving an optically transparent direct laser writing substrate on a translation stage so that a facet surface of the optically transparent direct laser writing substrate is in optical communication with a direct write laser, the optically transparent direct laser writing substrate comprises: a transverse waveguide writing surface that receives direct write laser light when disposed on the translation stage for off-axis direct write laser printing and the facet surface that receives the direct write laser light when disposed on the translation stage for on-axis direct write laser printing of the barcode-guided direct laser written optical coupling on the facet surface; a waveguide disposed in the optically transparent direct laser writing substrate and in optical communication with the facet surface; and an optically visible bulk impregnated barcode disposed in the optically transparent direct laser writing substrate and arranged proximate to the waveguide and in optical communication with the facet surface. producing direct write laser light by the direct write laser; acquiring an image of the facet surface with the optically visible bulk impregnated barcode and the waveguide observable in the image; analyzing the image to determine the position of the waveguide relative to the optically visible bulk impregnated barcode; positioning the optically transparent direct laser writing substrate relative to the direct write laser light from the direct write laser so that the direct write laser light is received at the facet surface on-axis at a position corresponding to the waveguide in the optically transparent direct laser writing substrate; and forming, in response to receiving the direct write laser at the facet surface, a barcode-guided direct laser written optical coupling on the facet surface on-axis at the position corresponding to the waveguide in the optically transparent direct laser writing substrate to form a barcoded end facet printed photonic chip from the optically transparent direct laser writing substrate.

BRIEF DESCRIPTION OF THE DRAWINGS

The following description cannot be considered limiting in any way. Various objectives, features, and advantages of the disclosed subject matter can be more fully appreciated with reference to the following detailed description of the disclosed subject matter when considered in connection with the following drawings, in which like reference numerals identify like elements.

FIG. 14 shows 1 dB and 3 dB diameters for the micro-optic method are around four times greater for the micro-optic technique than they are for the lensed-fiber technique, according to the Example.

DETAILED DESCRIPTION

Figure 1:
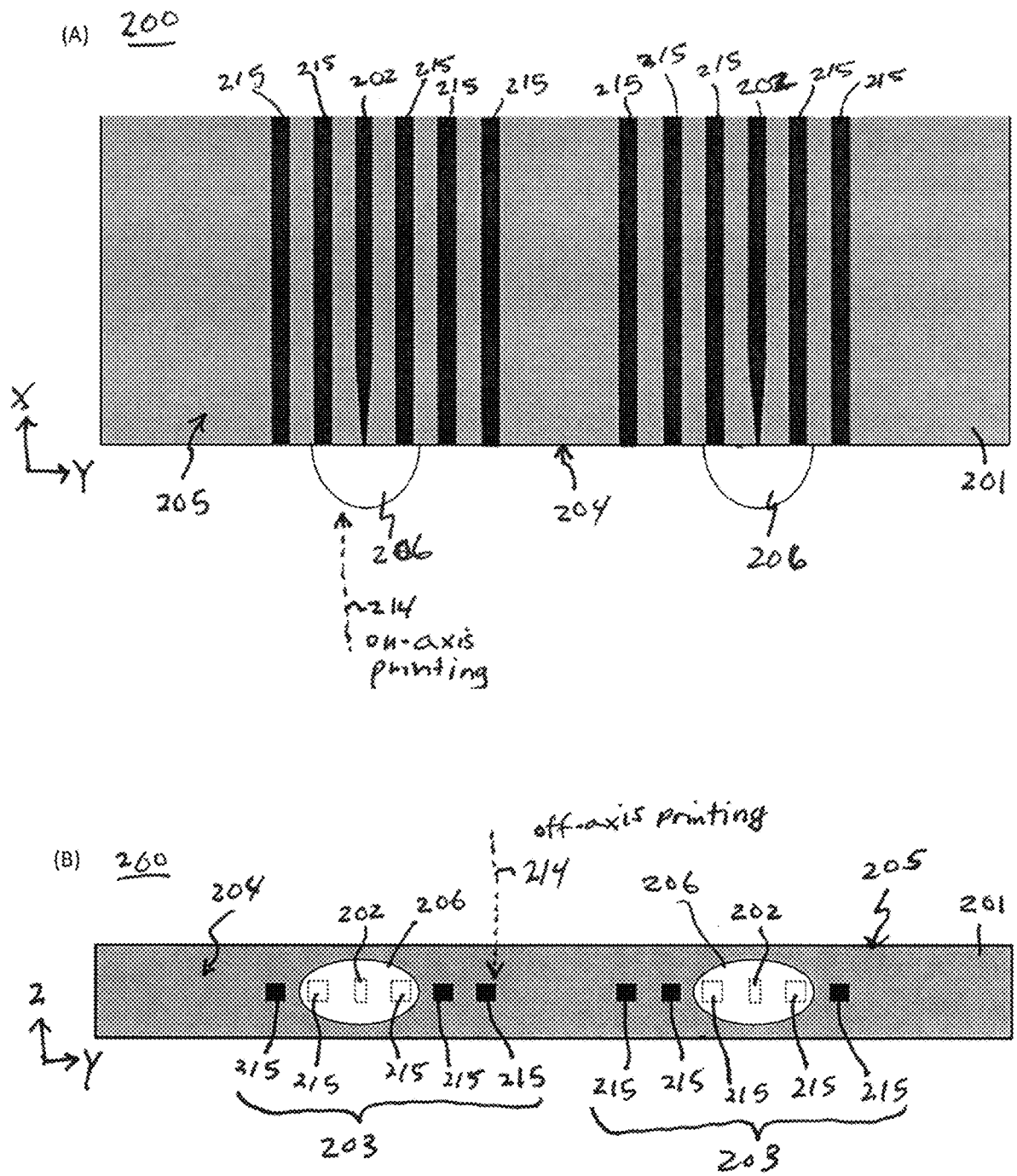
FIG. 1 shows a barcoded end facet printed photonic chip, according to some embodiments, in plan view in panel A and an end view in panel B.

A detailed description of one or more embodiments is presented herein by way of exemplification and not limitation.

Integrated photonic chips are used for a wide range of applications. For many of these applications, coupling light on and off of the photonic chip and into single optical fibers or optical fiber arrays and coupling light from one photonic chip to another photonic chip are desirable. Direct laser writing (DLW) of micro-optic structures can provide such optical coupling structures. The optical coupling structures can include lenses, mirrors, and other optics that are created in a polymer photoresist material by scanning of a focused laser beam in three dimensions in a direct laser writing process. These optical couplers are referred to as free-form because an arbitrary three-dimensional (3D) structure can be created as long as it is mechanically stable and within resolution limits of the DLW system. When printed directly on a facet of a photonic chip, the micro-optic elements provide an optical fiducial to print optical couplings that overcomes misalignment and can be used for single fiber coupling, fiber array coupling, and chip-to-chip coupling.

Printing micro-optic elements on the facets of photonic chips presents technical challenges. A common configuration for printing is with a microscope objective of the DLW system oriented normal to the chip surface (off-axis) so that printing occurs at a transverse waveguide writing surface. With this orientation, it is easy to determine where the printing should take place because the photonic chip elements are viewable, but the photonic chip obscures the direct write laser light, impacting the quality of the micro-optic element to be formed. The degree to which this is an issue depends on many factors, including the material of the photonic chip, size of the micro-optic element, and depth below transverse waveguide writing surface where that element is to be centered.

If the photonic chip, referred to as the optically transparent direct laser writing substrate, is rotated so that the microscope objective is oriented parallel to the chip surface (referred to as being on-axis), the obfuscation of the direct write laser light is overcome. But locating the specific position for forming the micro-optic elements to be written is removed if using conventional processes that involve a conventional alignment mark that are typically viewable in the off-axis orientation from transverse waveguide writing surface and are not viewable in the on-axis orientation as observed from the facet surface of the optically transparent direct laser writing substrate.

Embodiments herein overcome the above problem by a optically transparent direct laser writing substrate that includes an optically visible bulk impregnated barcode disposed proximate to the waveguide layer and that enables on-axis printing at specified locations (i.e., the waveguide inputs/outputs) with high accuracy and precision. The barcode members of the optically visible bulk impregnated barcode are viewable from the facet surface in the on-axis orientation of the optically transparent direct laser writing substrate and can be detected, e.g., in an automated process with machine vision, with a barcode-guided direct laser writer.

Optical micro-machining with direct write laser light is a direct-laser-write and rapid prototyping process for making integrated photonic chips. Strong focusing of direct write laser light into optically transparent direct laser writing substrate can induce positive refractive index modifications within the material and without surface damage. Direct laser writing provides flexible 3D structuring of various glasses and makes optical devices with selectively tailorable waveguides, couplers, Bragg gratings, waveplates, and the like are building blocks for 3D optical circuits.

Direct-laser-writing can confine strong nonlinear optical interactions that may induce, e.g., positive or negative refractive index changes in bulk transparent materials for creating optical waveguides (WGs). The mechanisms by which direct-laser-write modifications occur include, but are not limited to, multiphoton ionization, avalanche ionization, electron-atom collisions, plasma interactions, thermal effects (e.g. diffusion, heat accumulation), energy dissipation, and material cooling leading to inhomogeneous solidification. For direct-laser-writing waveguides, waveguide performance can be tuned and optimized by, but not limited to, the properties (pulse duration, pulse temporal shape, bandwidth and shape, pulse repetition rate, wavelength, polarization, and beam spatial shape) of the direct write laser light and the focusing conditions (lens numerical aperture, air/liquid immersion, translation direction and speeds, and the like).

Direct laser writing forms integrated photonic chips with micro-optic and photonic waveguide chip-to-chip and fiber-to-chip connections. However, conventional approaches, in which the laser lithography beam is oriented perpendicular to the chip surface, i.e., at the transverse waveguide writing surface rather than the facet surface, are limited in that they cannot write structures at any depth on chip facets and have to be concerned with specific materials included in the photonic chip. Moreover, conventional direct laser writing can involve complicated, structure-dependent simulations. Barcode-guided direct laser writing described herein involves an optically visible bulk impregnated barcode to locate the position of photonic waveguides when observed on-axis via facet surface. Accordingly, barcode-guided direct laser writing is fast and scalable for on-axis, facet-based DLW that can operate autonomously and overcome aforementioned issues and technical deficiencies of conventional direct laser writing.

Embodiments provide for optical packaging, fabrication, and optical packages that are compatible with integration of optoelectronic components. Certain embodiments employ a three-dimensional direct-write lithography system (referred to as a barcode-guided direct laser writer) for writing deeply-buried, localized index structures into a diffusion-mediated photopolymer. Barcode-guided direct laser writing, the barcoded end facet printed photonic chip, and the barcode-guided direct laser writer described herein provide advantages that include greater flexibility in the writing media (e.g., optically transparent direct laser writing substrate) and the use of low power, inexpensive, continuous-wave lasers. Index structures are written both parallel and perpendicular to the writing beam in different types of photopolymers, providing control over the feature size and shape. Embodiments provide systems that can be fully automatic, compact, mechanically robust, and inexpensive to operate for both large and small production volumes. Certain embodiments provide low cost and short processing cycles. Optical circuit components can be assembled with selective tolerances that can include fiber pig tailing or external packaging, producing an apparatus or article that is ready to ship after it comes off of the machine.

Conventional two-dimensional lithographic processing of photonic chips can include fiducial markings for sighting or alignment of etching and patterning of features in a single direction of exposure in a mainly planar arrangement through use of lithographic masks and etching with deposition through processes such as chemical vapor deposition. However, as noted above, these conventional process do not provide high-fidelity facet production of optical elements, and the barcode-guided direct laser writing, the barcoded end facet printed photonic chip, and the barcode-guided direct laser writer overcome the limitations of such constrained printing geometry of just direct write laser light directed at transverse waveguide writing surface 205.

Figure 2:
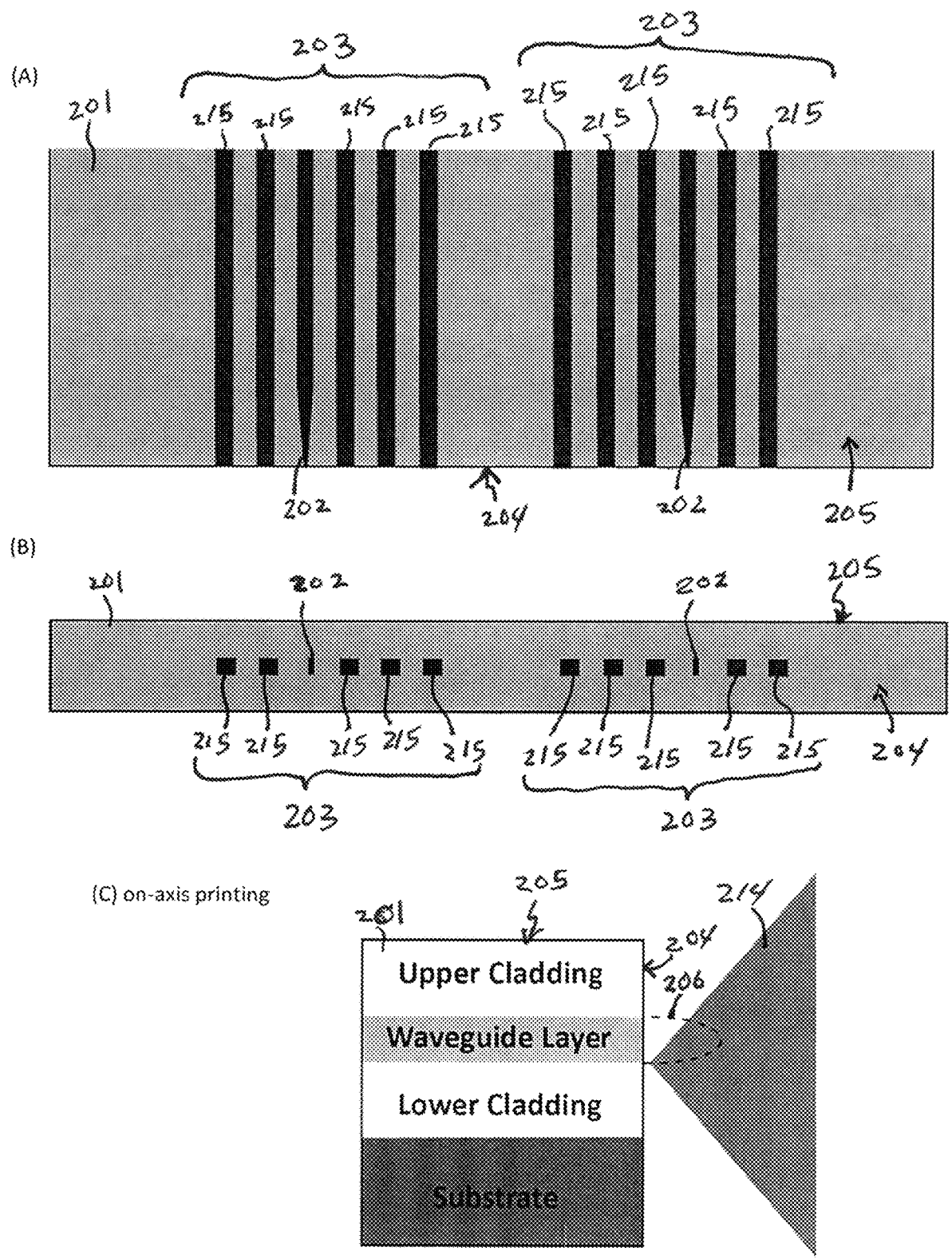
FIG. 2 shows a barcoded photonic chip, according to some embodiments, in plan view in panel A, an end view in panel B, and in a configuration for on-axis printing of a barcode-guided direct laser written optical coupling in panel C.
Figure 3:
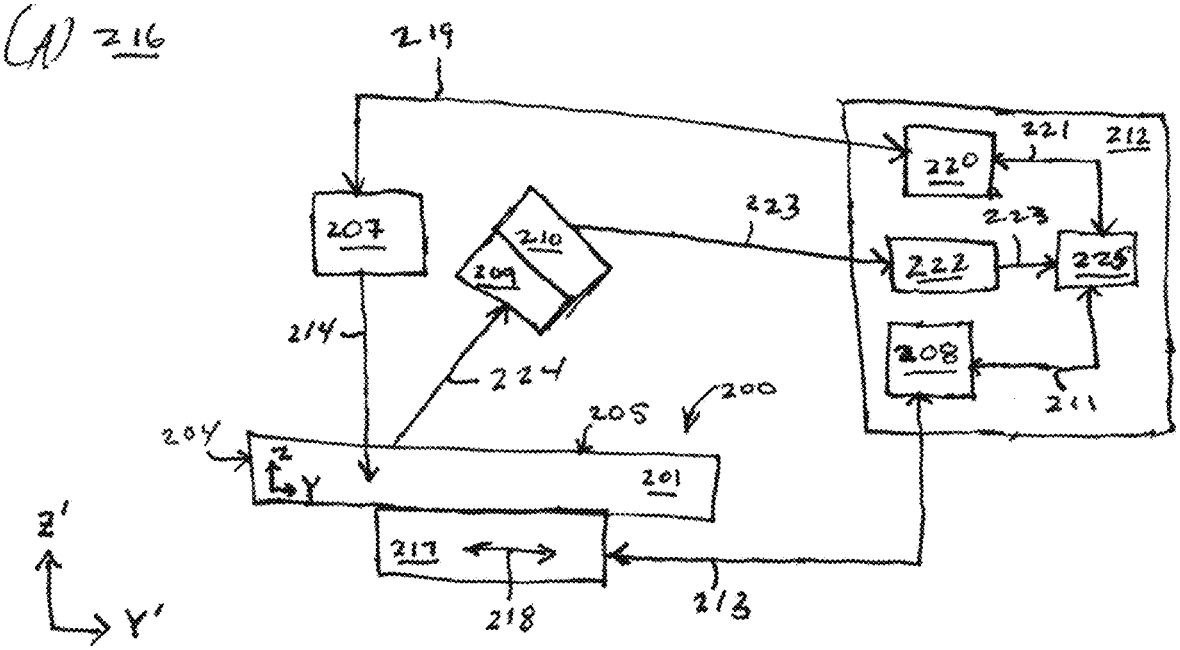
FIG. 3 shows a barcode-guided direct laser writer for barcode-guided direct laser writing of an optically transparent direct laser writing substrate in a configuration for transverse printing of a barcode and waveguide in panel A and in a configuration for on-axis printing of a barcode-guided direct laser written optical coupling in panel B, according to some embodiments.
Figure 3:
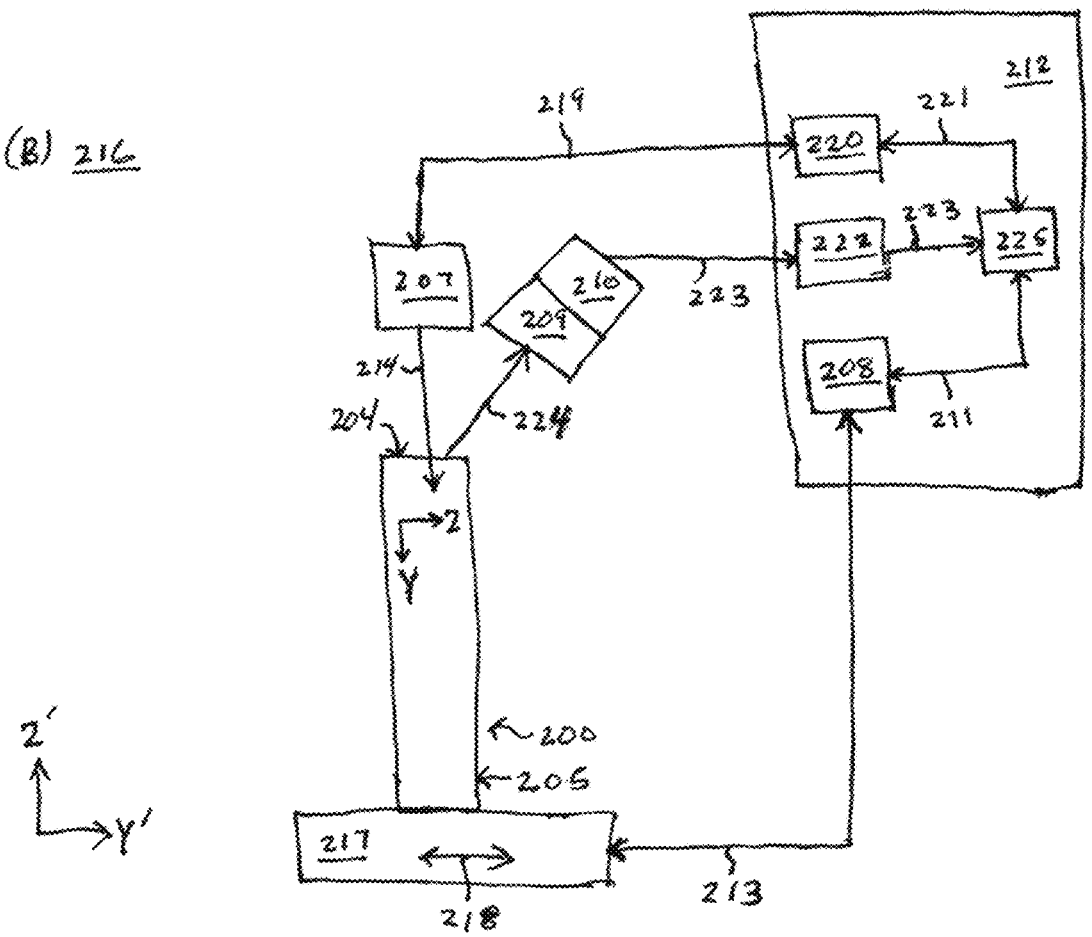

In an embodiment, with reference to FIG. 1, FIG. 2, and FIG. 3, barcoded end facet printed photonic chip 200 includes: optically transparent direct laser writing substrate 201 including transverse waveguide writing surface 205 to receive direct write laser light 214 for off-axis direct write laser printing and facet surface 204 to receive direct write laser light 214 for on-axis direct write laser printing of barcode-guided direct laser written optical coupling 206 on facet surface 204; waveguide 202 disposed in optically transparent direct laser writing substrate 201 and in optical communication with facet surface 204; and optically visible bulk impregnated barcode 203 disposed in optically transparent direct laser writing substrate 201 arranged proximate to waveguide 202 and in optical communication with facet surface 204.

In an embodiment, barcoded end facet printed photonic chip 200 includes barcode-guided direct laser written optical coupling 206 disposed on facet surface 204 in response to on-axis direct write laser printing by direct write laser light 214.

In an embodiment, optically visible bulk impregnated barcode 203 includes a plurality of barcode members 215. The barcode members 215 can be distributed laterally with respect to waveguide 202 as observed from facet surface 204. Although barcode member 215 is shown, e.g., in FIG. 1, as being an elongate strip, other shapes, formats, and sizes are contemplated including dots, meanders, regular shapes (e.g., polygons such as parallelepipeds, tetrahedrons, polyhedrons, and the like), or arbitrary shapes that may or may not involve symmetry. The number of barcode members can be selected for a particular application and can be, e.g., 1, 2, 3, or as many as desired. The spacing (e.g., pitch) of adjacent bar code members 215 can be identical or not. The material of the barcode member 215 can be formed from the optically transparent direct laser writing substrate 201 (e.g., by direct laser writing) or disposed chemically (e.g., by a chemical growth mechanism), mechanically, or optically in optically transparent direct laser writing substrate 201 and has a different refractive index than the optically transparent direct laser writing substrate 201 to provide a machine vision discernable index for referencing the position of waveguide 202.

Although waveguide 202 is shown, e.g., in FIG. 1, as being an elongate strip, other shapes, formats, and sizes are contemplated including dots, meanders, regular shapes (e.g., polygons such as parallelepipeds, tetrahedrons, polyhedrons, and the like), or arbitrary shapes that may or may not involve symmetry as well as different optical formats that allow electromagnetic storage such as an optical resonator or optical cavity. The number of waveguides can be selected for a particular application and can be, e.g., 1, 2, 3, or as many as desired. The spacing of waveguides 202 can be selected as desired. The material of the waveguide 202 can be formed from the optically transparent direct laser writing substrate 201 (e.g., by direct laser writing) or disposed chemically (e.g., by a chemical growth mechanism), mechanically, or optically in optically transparent direct laser writing substrate 201 and has a different refractive index than the optically transparent direct laser writing substrate 201.

Optically transparent direct laser writing substrate 201 includes a polymer, glass, or a combination comprising polymer and glass but is not so limited so long as the material when subjected to direct laser writing forms barcode-guided direct laser written optical coupling 206 or other optical features. In addition to the waveguide layer and upper and lower cladding as illustrated in FIG. 2, this can include additional waveguiding and cladding layers, as well as opaque or reflective layers. The shape and size of optically transparent direct laser writing substrate 201 is arbitrary and can be compatible with integrated photonic chips. In an embodiment, facet surface 204 is arranged at an oblique angle to transverse waveguide writing surface 205.

Barcode-guided direct laser written optical coupling 206 can include various optical elements such as lenses, mirrors, gratings, and the like. In an embodiment, barcode-guided direct laser written optical coupling 206 includes a lens for receiving a laser light and optically coupling the laser light into or out of the waveguide 202.

In an embodiment, optically transparent direct laser writing substrate 201 receives direct write laser light 214, forms three-dimensional optical structures in optically transparent direct laser writing substrate 201 in response to receiving direct write laser light 214, and forms integrated photonic chips including the three-dimensional optical structures. In this manner, optical circuits can be made with barcode-guided direct laser written optical coupling 206 formed on facet surface 204.

In an embodiment, with reference to FIG. 3, barcode-guided direct laser writer 216 for barcode-guided direct laser writing of optically transparent direct laser writing substrate 201 includes: translation stage 217 that receives optically transparent direct laser writing substrate 201 in an off-axis printing orientation (panel A, FIG. 3) or an on-axis printing orientation (panel B, FIG. 3) with respect to direct write laser 207; direct write laser 207 in optical communication with optically transparent direct laser writing substrate 201 and that produces direct write laser light 214; optical objective 209 in optical communication with optically transparent direct laser writing substrate 201 and that receives image 224 of optically transparent direct laser writing substrate 201; light sensor 210 in optical communication with optically transparent direct laser writing substrate 201 via optical objective 209 and that receives image 224 from optical objective 209 and produces image data 223 from image 224; analyzer 212 in electrical communication with direct write laser 207, light sensor 210, and translation stage 217 and that: controls direct write laser 207 so that direct write laser 207 produces direct write laser light 214 under the control of analyzer 212; receives image data 223 from light sensor 210 and controls direct write laser 207 and translation stage 217 based on image data 223; determines a position of waveguide 202 in optically transparent direct laser writing substrate 201 relative to optically visible bulk impregnated barcode 203 disposed in optically transparent direct laser writing substrate 201; and controls translation stage 217 so that translation stage 217 positions optically transparent direct laser writing substrate 201 relative to direct write laser 207 under control of analyzer 212 to make barcode-guided direct laser written optical coupling 206 on facet surface 204 of optically transparent direct laser writing substrate 201 to form barcoded end facet printed photonic chip 200 from optically transparent direct laser writing substrate 201 via barcode-guided direct laser writing, wherein optically transparent direct laser writing substrate 201 forms barcode-guided direct laser written optical coupling 206 in response to receipt of direct write laser light 214 from direct write laser 207 at facet surface 204, and optically transparent direct laser writing substrate 201 includes: transverse waveguide writing surface 205 that receives direct write laser light 214 when disposed on translation stage 217 for off-axis direct write laser printing and facet surface 204 that receives direct write laser light 214 when disposed on translation stage 217 for on-axis direct write laser printing of barcode-guided direct laser written optical coupling 206 on facet surface 204; waveguide 202 disposed in optically transparent direct laser writing substrate 201 and in optical communication with facet surface 204; and optically visible bulk impregnated barcode 203 disposed in optically transparent direct laser writing substrate 201 arranged proximate to waveguide 202 and in optical communication with facet surface 204.

In an embodiment, analyzer 212 includes: laser controller 220 in communication with direct write laser 207 and in communication with processor 225 and that receives laser data 221 from processor 225 and produces direct write control signal 219 that is communicated from laser controller 220 to direct write laser 207, such that direct write laser 207 produces direct write laser light 214 under control of direct write control signal 219; imaging controller 222 in communication with light sensor 210 and in communication with processor 225 and that receives image data 223 from light sensor 210 and communicates image data 223 to processor 225; and laser-substrate position controller 208 in communication with translation stage 217 and in communication with processor 225 and that receives position control signal 213 from processor 225 and produces position control signal 213 that is communicated from laser-substrate position controller 208 to translation stage 217, such that translation stage 217 moves optically transparent direct laser writing substrate 201 relative to direct write laser light 214 under control of position control signal 213.

In an embodiment, optically transparent direct laser writing substrate 201 receives direct write laser light 214 from direct write laser 207, forms three-dimensional optical structures in optically transparent direct laser writing substrate 201 in response to receiving direct write laser light 214, and forms integrated photonic chips including the three-dimensional optical structures.

In an embodiment, a process for barcode-guided direct laser writing of optically transparent direct laser writing substrate 201 includes: receiving optically transparent direct laser writing substrate 201 on translation stage 217 so that facet surface 204 of optically transparent direct laser writing substrate 201 is in optical communication with direct write laser 207, optically transparent direct laser writing substrate 201 includes: transverse waveguide writing surface 205 that receives direct write laser light 214 when disposed on translation stage 217 for off-axis direct laser printing and facet surface 204 that receives direct write laser light 214 when disposed on translation stage 217 for on-axis direct write laser printing of barcode-guided direct laser written optical coupling 206 on facet surface 204; waveguide 202 disposed in optically transparent direct laser writing substrate 201 and in optical communication with facet surface 204; and optically visible bulk impregnated barcode 203 disposed in optically transparent direct laser writing substrate 201 and arranged proximate to waveguide 202 and in optical communication with facet surface 204; producing direct write laser light 214 by direct write laser 207; acquiring image 224 of facet surface 204 with optically visible bulk impregnated barcode 203 and waveguide 202 observable in image 224; analyzing the image to determine the position of waveguide 202 relative to optically visible bulk impregnated barcode 203; positioning optically transparent direct laser writing substrate 201 relative to direct write laser light 214 from direct write laser 207 so that direct write laser light 214 is received at facet surface 204 on-axis at a position corresponding to waveguide 202 in optically transparent direct laser writing substrate 201; and forming, in response to receiving direct write laser 207 at facet surface 204, barcode-guided direct laser written optical coupling 206 on facet surface 204 on-axis at the position corresponding to waveguide 202 in the optically transparent direct laser writing substrate 201 to form barcoded end facet printed photonic chip 200 from optically transparent direct laser writing substrate 201.

In an embodiment, analyzing the image to determine the position of waveguide 202 relative to optically visible bulk impregnated barcode 203 includes: controlling direct write laser 207 so that direct write laser 207 produces direct write laser light 214 under the control of direct write control signal 219; controlling direct write laser 207 and translation stage 217 based on image 224 of optically transparent direct laser writing substrate 201; determining a position of waveguide 202 in optically transparent direct laser writing substrate 201 relative to optically visible bulk impregnated barcode 203 disposed in optically transparent direct laser writing substrate 201; and controlling translation stage 217 so that the translation stage 217 positions optically transparent direct laser writing substrate 201 relative to direct write laser 207 to make barcode-guided direct laser written optical coupling 206 on facet surface 204 of optically transparent direct laser writing substrate 201 to form barcoded end facet printed photonic chip 200 from the optically transparent direct laser writing substrate 201.

In an embodiment, barcode-guided direct laser writing includes receiving, by laser controller 220 of analyzer 212 that is in communication with direct write laser 207 and processor 225 of analyzer 212, laser data 221 from processor 225; producing, by laser controller 220, direct write control signal 219; communicating, from laser controller 220 to direct write laser 207, direct write laser 207; producing, by direct write laser light 214, direct write laser light 214 under control of direct write control signal 219; receiving, by imaging controller 222 of analyzer 212 that is in communication with light sensor 210 that acquires image 224 and in communication with processor 225, image data 223 from light sensor 210; communicating image data 223 from imaging controller 222 to processor 225; and receiving, by laser-substrate position controller 208 of analyzer 212 in communication with translation stage 217 and in communication with processor 225, position control signal 213 from processor 225; producing, by laser-substrate position controller 208, position control signal 213 and communicating position control signal 213 from laser-substrate position controller 208 to translation stage 217; and moving, by translation stage 217, optically transparent direct laser writing substrate 201 relative to direct write laser light 214 under control of position control signal 213.

In an embodiment, barcode-guided direct laser writing includes receiving, by optically transparent direct laser writing substrate 201, direct write laser light 214 from direct write laser 207, forming three-dimensional optical structures in optically transparent direct laser writing substrate 201 in response to receiving direct write laser light 214, and forming integrated photonic chips comprising the three-dimensional optical structures. Barcode-guided direct laser written optical coupling 206 can include a lens for receiving a laser light and optically coupling the laser light into or out of the waveguide 202.

Figure 4:
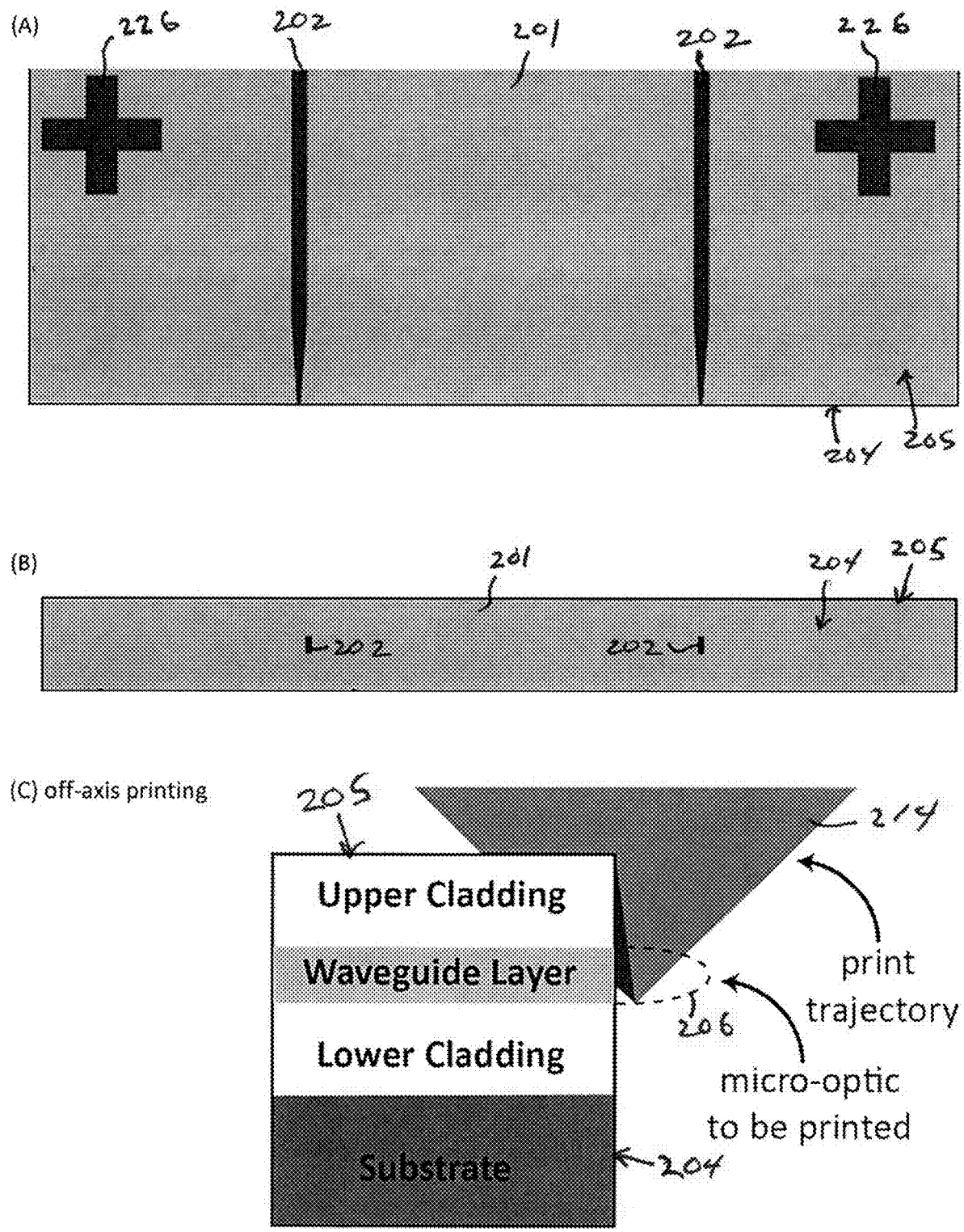
FIG. 4 shows a photonic chip with alignment marks in plan view in panel A, an end view in panel B, and in a configuration for transverse printing in panel C.

It should be appreciated that barcode-guided direct laser writing includes direct laser writing of micro-optics (or other structures) on facets of nanophotonic chips. Although conventional approaches may rely on the approach shown in FIG. 4, where a lithography beam is perpendicular to transverse waveguide writing surface 205 in an off-axis orientation. This leads to several limitations that can include any of the following: the size or location of the object to be printed are limited by the working distance of the lithography objective; material compatibility is reduced due to the strong absorption/reflectivity of certain materials (e.g. Si); optical access to the input port of a chip may be obscured by the chip itself or other structures on the device. This causes a shadow to form along the optical path and leads to distortions at the focal point, and thus in whatever device is to be printed. Without correction, such distortions can cause device performance degradation. Some conventional technologies compensate the shadowing effect using electromagnetic simulations that result in a structure-dependent and spatially non-uniform exposure dose. However, such corrections may not be universally applicable, for example, if the layers of the photonic chip that partially obscure the beam are highly absorbing or reflective.

Barcode-guided direct laser writing overcomes these problem independently of structure and material by printing directly on-axis with the device layer of a photonic chip on facet surface 204 as shown in FIG. 3c. Printing in the on-axis orientation involves accurate determination of the locations at which elements are to be printed and is harder in the on-axis orientation than the off-axis orientation because less information is observable in an image taken from the on-axis orientation from facet surface 204. That is, when printing in conventional off-axis orientation, the entire plane of the device layer provides location information using, e.g., alignment mark 226. When viewed from facet surface 204, this plane is contracted to a line, rendering conventional alignment mark 226 effectively useless, limiting the accuracy or precision of localization techniques, and becoming sensitive to imperfections on the chip facet.

Figure 16:
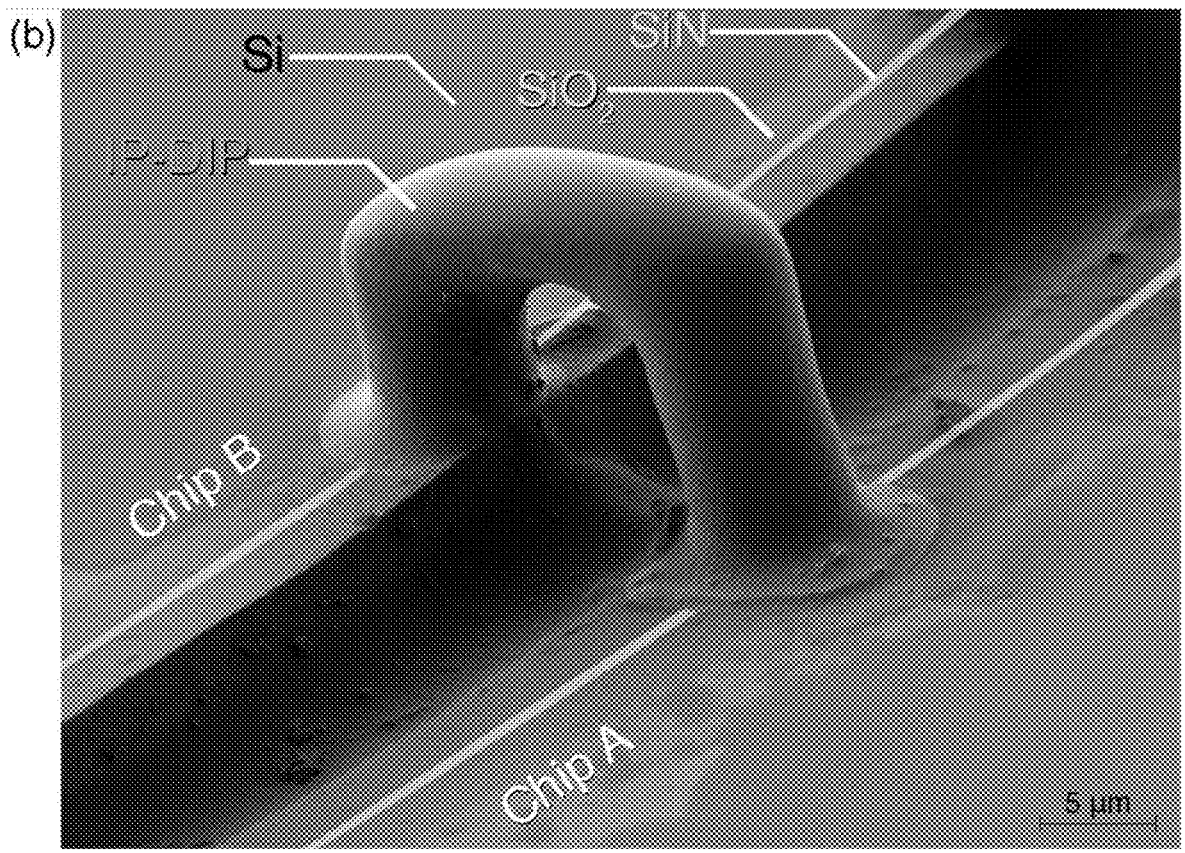
FIG. 16 shows results from on-axis 3D printing of a chip-to-chip photonic wire bond formed using an optically visible bulk impregnated barcode in each waveguide layer for alignment and guiding of the printing.

Barcode-guided direct laser writing and barcoded end facet printed photonic chip 200 provide edge-based localization by presence of optically visible bulk impregnated barcode 203 in the device layer of barcoded end facet printed photonic chip 200. Optically visible bulk impregnated barcode 203 do not require any additional processing steps and can be design changes to the mask used when fabricating barcoded end facet printed photonic chip 200. Optically visible bulk impregnated barcode 203 provide a distinct pattern of barcode members 215 in on-axis imaging from facet surface 204 that is robust to imperfections and contamination of facet surface 204. Advantageously, controlling barcode-guided direct laser writing with machine vision processing robustly detects and identifies optically visible bulk impregnated barcode 203 using image-processing techniques and can accelerate commercialization of nanophotonic devices. Furthermore, such provides new packaging techniques that are not provided by off-axis printing such as the interconnect that bridges two photonic chips that are vertically stacked shown in FIG. 16. This type of connection can form dense assemblies of optically-connected photonic chips that otherwise would be very challenging to fabricate via the off-axis printing orientation. Moreover, barcode-guided direct laser writing aids automation of direct laser writing for packaging of optical devices into more complex systems for automatically printing micro-optic structures that couple on-chip light to off-chip fibers or vice-versa. Beneficially, barcode-guided direct laser writing avoids the shadowing effect, removes size restrictions, and improves material compatibility even in an absence of sophisticated modeling tools that would otherwise be used when a new structure is written. It will be appreciated that different types of optical coupling elements can be fabricated with barcode-guided direct laser writing. Moreover, barcoded end facet printed photonic chip 200 can be made of various elements and components that are microfabricated.

The articles and processes herein are illustrated further by the following Example, which is non-limiting.

EXAMPLE

Automated On-Axis Direct Laser Writing of Coupling Elements for Photonic Chips

Direct laser writing can create versatile micro-optic structures that facilitate photonic-chip coupling, like free-form lenses, free-form mirrors, and photonic wire bonds. However, at the edges of photonic chips, the top-down/off-axis printing orientation typically used limits the size and complexity of structures and the range of materials compatible with the DLW process. To avoid these issues, we develop a DLW method, referred to as barcode-guided direct laser writing, in which the photonic chip's optical input/output (IO) ports can be co-linear with the axis of the lithography beam (on-axis printing). Alignment automation and port identification are enabled by a one-dimensional barcode-like pattern that is fabricated within the chip's device layer and surrounds the IO waveguides to increase their visibility. We demonstrate passive alignment to these markers using standard machine vision techniques, and print single-element elliptical lenses along an array of 42 ports with a 100% fabrication yield. These lenses improve fiber-to-chip misalignment tolerance relative to other fiber-based coupling techniques. The 1 dB excess loss diameter increases from ≈2.3 µm when using a lensed fiber to ≈9.9 µm when using the DLW printed micro-optic and a cleaved fiber. The insertion loss penalty introduced by moving to this misalignment-tolerant coupling approach is limited, with an additional loss (in comparison to the lensed fiber) as small as ≈1 dB and ≈2 dB on average. On-axis printing can accommodate a variety of multi-element free-space and guided wave coupling elements, without requiring calibration of printing dose specific to the geometry of the 3D printed structure or to the materials comprising the photonic chip. It also enables interconnection between chips such as in a 3D photonic wire bond between two vertically stacked photonic chips.

Nanophotonic devices created in photonic chips have ushered in significant advances in computer and data communications, sensing, nonlinear optics, and quantum optics. Even so, efficient and robust optical coupling between on-chip devices and the outside world remains a challenging problem. As the exciting applications of nanophotonic technologies continue to mature, the importance of robust and cost-effective packaging methods will become a pressing priority, given that they already present a significant bottleneck in the commercialization of photonic integrated circuits (PICs).

Fiber-to-chip coupling can include end-fire approaches, wherein inverse tapered waveguides can be implemented to improve efficiency, End-fire techniques, such as the use of lensed optical fibers that easily produce a focused optical spot from a standard single mode fiber input, offer a large coupling bandwidth and ease of use, but often suffer from a high sensitivity to misalignment. Depending on the on-chip waveguide geometry, a lensed fiber may have a 1 dB misalignment tolerance of ±0.5µ±0.5 µm to ±1µ±1 µm, which is difficult to satisfy using passive alignment. In contrast, grating couplers can extend this tolerance significantly, but (in general) they suffer from smaller coupling bandwidths and often require additional fabrication steps to achieve high efficiency coupling.

Direct laser writing provides miniaturization of linear optical elements for versatility in the nanophotonics platform. DLW can be used to create free-form lenses, total-internal-reflection mirrors, and photonic wire bonds that improve fiber-to-chip coupling for photonic chips. The flexibility of DLW systems permits creation of plug-and-play-type solutions and broadband out-of-plane coupling, Despite the tremendous progress made with DLW, its implementation is still challenging in some contexts. Specifically, this includes the ability to write structures at any depth on the chip facets, without regard to the specific materials comprising the chip, and without the need for complicated, structure-dependent simulations.

In this Example, barcode-guided direct laser writing involves machine vision with barcode-like patterns to overcome the aforementioned fabrication challenges associated with printing micro-optic elements on chip facets (i.e., input/output (IO) ports). Conventional DLW methods have lithography beams that get obstructed when printing at the edge of the chip, reducing the size and optical quality of the printed micro-optics and limiting the materials compatible with the DLW process. To solve these issues, barcode-guided direct laser writing orients photonic chips so that the lithography beam can access the IO facet of a photonic chip without obstruction. Printing from this orientation can include labeling and detection of very small features 200 nm length scale), which are problems simultaneously solved by incorporating high-visibility information-encoding barcode-like markers. A machine-vision process can include image processing techniques that reliably detects, reads, and aligns-to the barcode patterns. Using barcode-guided direct laser writing, micro-optic lenses were formed along an array of waveguides as well as a photonic wire bond between vertically stacked chips.

Challenges with Off-Axis Printing

Printing micro-optic elements on facets of photonic chips was done conventionally with top-down (off-axis) printing, resulting in challenges due to the orientation of the chip with respect to the lithography beam. Consider the photonic chip schematically depicted in FIG. 5(a), where a waveguide core is embedded in a lower refractive index cladding on top of an opaque substrate. The waveguide core can be made of materials like Si, $Si_3N_4$, or GaAs, and the cladding can be $SiO_2$. The IO ports of the waveguide employ an inverse taper geometry, which improves coupling to optical fibers by better matching the mode profile of the waveguide to that of the fiber.

Figure 5:
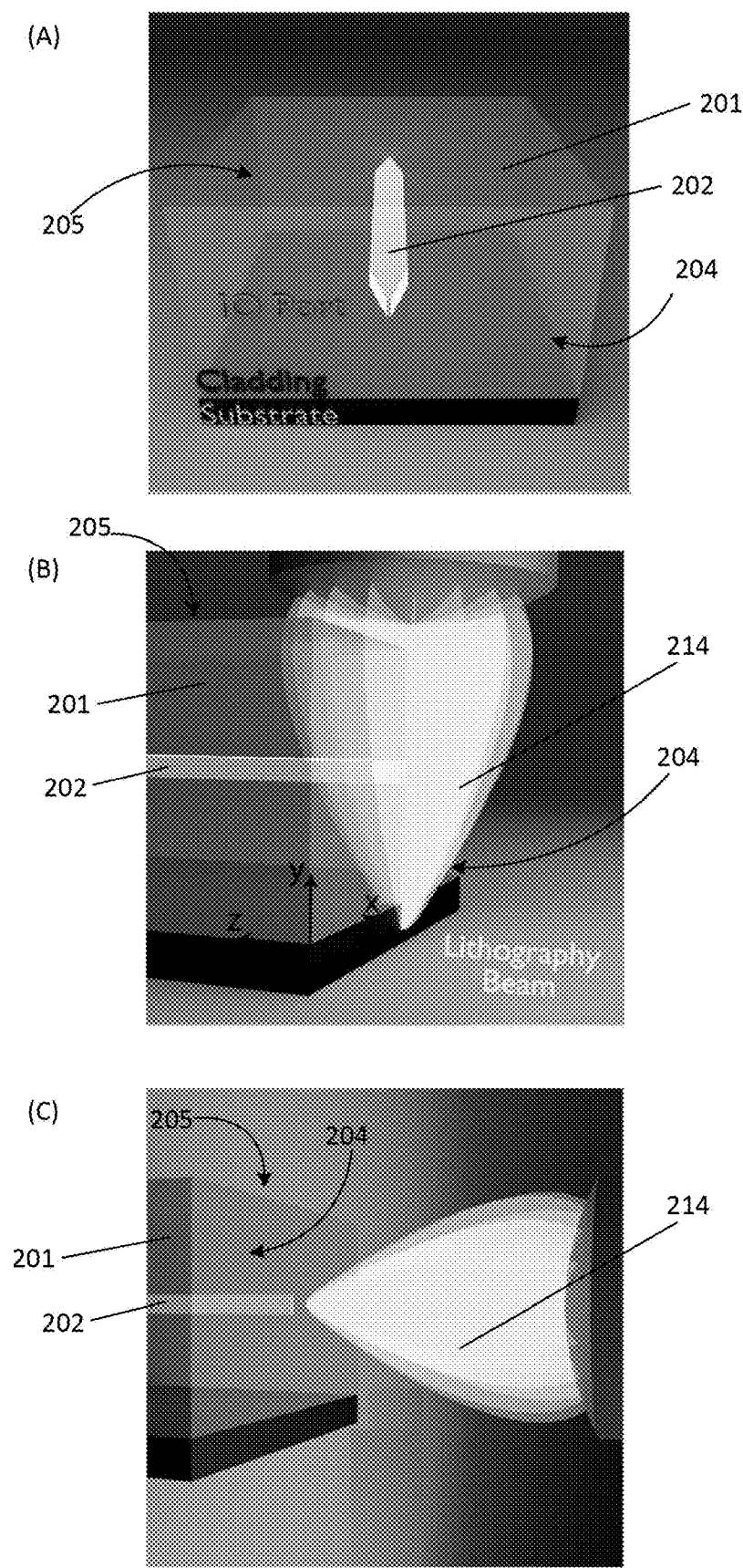
FIG. 5 shows that direct laser writing on the facet of a conventional photonic chip can be blocked or obfuscated when done from an off-axis perspective with a direction propagation of direct write laser light mainly orthogonal to a transverse waveguide writing surface and parallel to a facet surface of an optically transparent direct laser writing substrate. (a) A device in a conventional photonic chip can include a high refractive index waveguide core surrounded by a lower refractive index cladding on a high refractive index substrate. The waveguide core is tapered down to a small width at the facet to create an input/output (IO) port with improved mode matching, and hence optical coupling, to a single-mode optical fiber. (b) With off-axis printing, the lithography beam referred to the direct write laser light from the DLW system is partially obstructed by the cladding when printing an optical structure at the facet surface, and the working distance of the objective limits the size and depth of the printable area. The influence of this obstruction becomes more significant if the cladding refractive index is larger or if a reflective layer (e.g., metal) is present. (c) Rotating the relative orientation of chip presented to the direct write laser light for on-axis printing provides the primary axis of the port to be presented co-linear with the axis of the lithography beam to prevent obstruction of direct write laser light and enable printing with an objective of any working distance, regardless of the specific material stack comprising the photonic chip, according to the Example.

Attempting to print on the IO port of such a typical chip in the conventional manner, from the top-down (off-axis) perspective shown in FIG. 5(b), can limit the micro-optic structure. The size and depth of the structure can be limited by the working distance of the objective. The waveguiding layer is just a few micrometers below the chip surface so that this is not a practical limitation, and there are scenarios in which this is not the case, including 3D assemblies of chip stacks or highly integrated systems in which metallic layers associated with control electronics lie above the photonics. Near the facet, the lithography beam will partially overlap with the chip, as shown in FIG. 5(b), causing aberrations that distort the focal point. This is known as the shadowing effect, and previous studies indicate that it can decrease the effective dose at the focal point and deteriorate the quality of the focused beam. One can dynamically adjust the power of the beam so that the effective dose remains constant, but this requires dispersion simulations for each micro-optic design and still suffers from decreased focal spot quality. It may be assumed that the layers of the photonic chip are transparent at the wavelength of the lithography beam, so that the primary effect is dispersive. The photonic chip can contain reflective and absorptive layers like metallic traces or silicon layers which absorb commonly used lithography wavelengths (e.g., 780 nm), These layers would cause a significant distortion of the lithography beam and would be hard to compensate.

On-Axis Printing with Barcode Patterns

To circumvent the issues associated with off-axis printing, we propose writing structures in the on-axis orientation shown in FIG. 5(c), so that the IO facet of a chip is perpendicular to the lithography beam. This change in orientation removes limitations on the micro-optic size set by the working distance of the objective, avoids any obstruction of the lithography beam, and reduces the possibility of unwanted absorption/reflections since the lithography beam interacts only with the facet of the device, rather than each boundary in the layer stack. On the other hand, orienting the chip for on-axis printing introduces a new set of challenges, primarily related to the ability to image the facet well enough for high-accuracy localization of the waveguide terminations (IO ports). We note that this challenge is distinct from that faced in previous implementations of DLW in on-axis configurations, where, for example, structures have been written on the facets of optical fibers. In such instances, injection of laser light into the fiber could enable its active alignment to the lithography beam, while passive alignment has also been pursued. However, passive on-axis alignment to fiber facets is a qualitatively different challenge from the one addressed here, on-axis alignment to nanophotonic waveguides, due to the critical feature sizes encountered. Whereas the core diameter of a typical single mode fiber for 1550 nm operation is ≈9 μm, a photonic waveguide at a chip facet may be just a couple hundred nanometers in width. Since the waveguides themselves are used as alignment features, it is more challenging to align to an inversely tapered on-chip waveguide than an optical fiber. A second challenge associate with on-axis printing is the absence of traditional labels, which provide information about the device connected to a given IO port.

Figure 6:
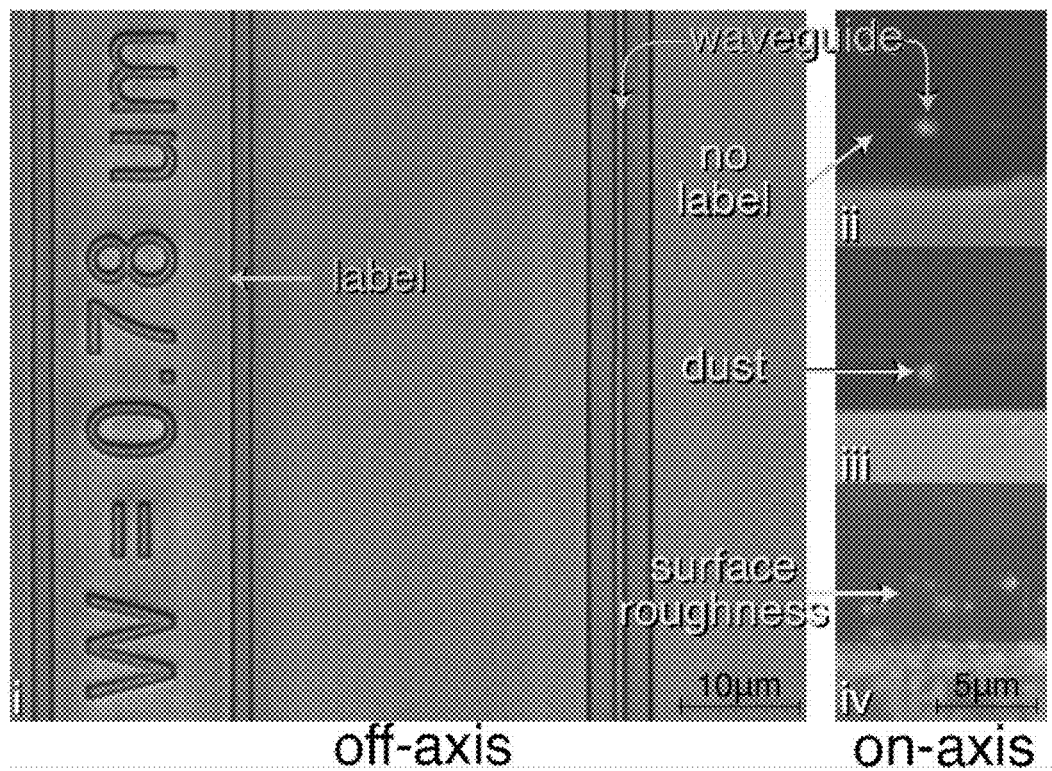
FIG. 6 shows a results from off-axis and on-axis perspectives of viewing conventional waveguides (a) and waveguides with adjacent optically visible bulk impregnated barcode (b). From the off-axis perspective (a, i), features like labels or waveguides are easily identifiable. From the on-axis perspective (a, ii-iv), only the cross section of the waveguide can be imaged, hence, the waveguide becomes a small dot (a, ii) that can be confused with dust (a, iii) or spurious reflections (a, iv) from surface imperfections. The optically visible bulk impregnated barcode in (b) provides a fiducial that can be read from both orientations with high visibility and tolerance to surface imperfections due to its large spatial extent. While in image (b, ii) the waveguide is visible, in image (b, iii) the waveguide is not visible, and reflections from contaminant particles are present. The center of the waveguide is inferred after detection of barcode members of the optically visible bulk impregnated barcode. In panel (b, i), a DLW-printed micro-lens is printed at the facet surface of the optically transparent direct laser writing substrate, according to the Example.
Figure 6:
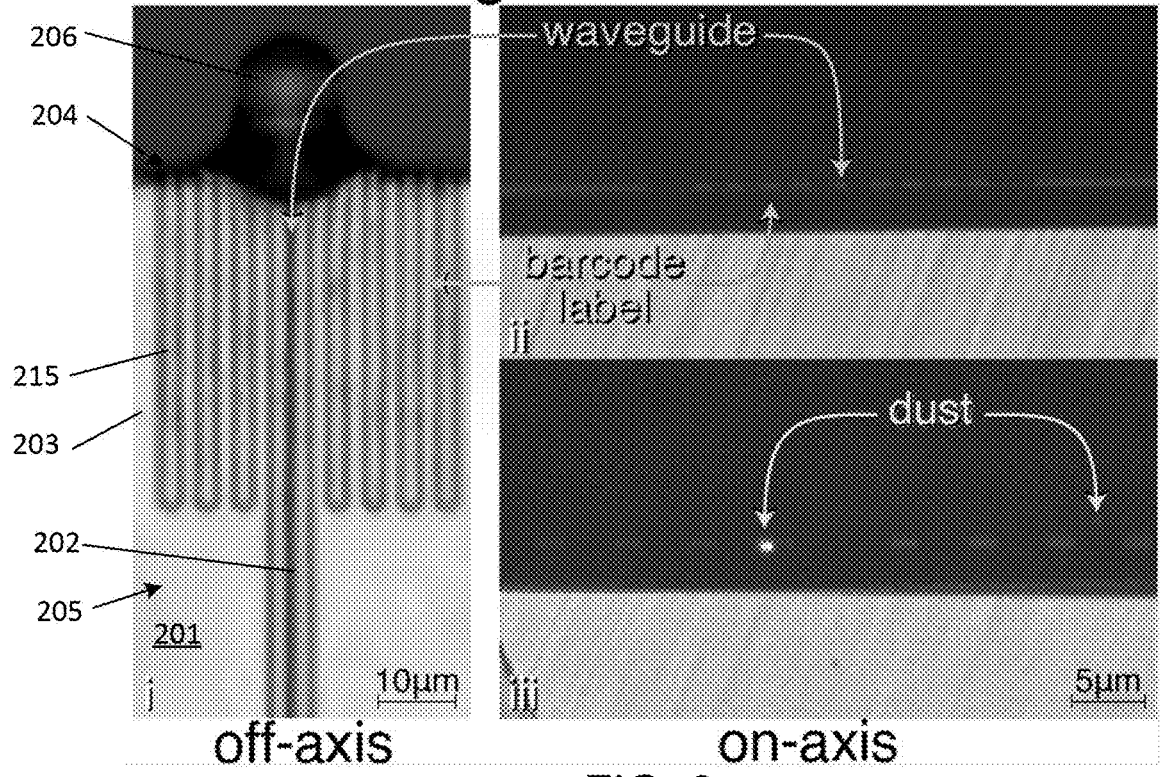

FIG. 6 shows off-axis and on-axis images of a waveguide device in a photonic chip. This specific chip is comprised of a 550 nm thick silicon nitride ($Si_3N_4$) waveguide core surrounded by ≈6 μm of silicon dioxide ($SiO_2$) cladding (≈3 μm above and below the waveguide), all on a silicon (Si) substrate. The waveguides are 1 μm wide, and are tapered down to a nominal width of 200 nm at the facet. Such a relatively thick $Si_3N_4$ layer is consistent with our recent demonstrations of nonlinear optical functionality in this platform. From the off-axis perspective, the entire plane of the device layer can be clearly imaged (FIG. 6(a-b, i)), which provides easy-to-see labels and unmistakable waveguides. From the on-axis perspective (FIG. 6(a, ii-iv) and FIG. 6(b, ii-iii)), on the other hand, the information in the plane of the device layer (i.e., markers, labels, and waveguide locations) is reduced to the 1D intersection of the device layer with the edge of the photonic chip. As shown in FIG. 6(a, i) and FIG. 6(b, i), a waveguide that appears as a long line from the off-axis perspective is reduced to a small spot when viewed from the on-axis perspective (FIG. 6(a, ii)), and labels are no longer visible. FIG. 6(a, ii) shows an example of an ideal situation, where the imaging/facet quality is such that the waveguide termination at the facet is clearly visible. Such images suggest that a blob-finding algorithm could be applied to determine the waveguide center, enabling aligned lithography of a micro-optic element. Clean images are highly sensitive to illumination conditions and can be atypical since reflections from contaminants and surface imperfections, which can be common (and dependent on facet preparation), are difficult to differentiate from the waveguide itself (FIG. 6(a, iii-iv)).

To address the visibility and information losses associated with on-axis imaging, we introduce barcode patterns (FIG. 6(b)), which transfer information from the device-layer plane to the device-layer edge while providing high-visibility markers that can be read and aligned-to from the on-axis perspective. These barcodes consist of a simple series of stripes that run parallel to the waveguide and extend all the way to the chip facet, so that they are visible when the chip is oriented in the on-axis position. The markers can encode information in the number, spacing, and width of the bars, as well as in binary encoding (bar/no bar). For example, the waveguide in FIG. 6(b, i) has a barcode consisting of three bars to the left and four bars to the right of the waveguide, but all the bars are of equal width. Furthermore, the cross-section of the markers, viewed on-axis in FIG. 6(b, ii-iii), is large enough to reduce sensitivity to spurious reflections. Moreover, even if the waveguide is itself not easily imaged, the barcode pattern is, and the waveguide center can be inferred from the location of the barcode elements. It is important to note that the barcode stripes have sufficient separation from the IO waveguide (≈2 μm on each side) to avoid deterioration of its optical mode or undesired coupling to slab modes.

Machine Vision Using Barcode Patterns

Figure 7:
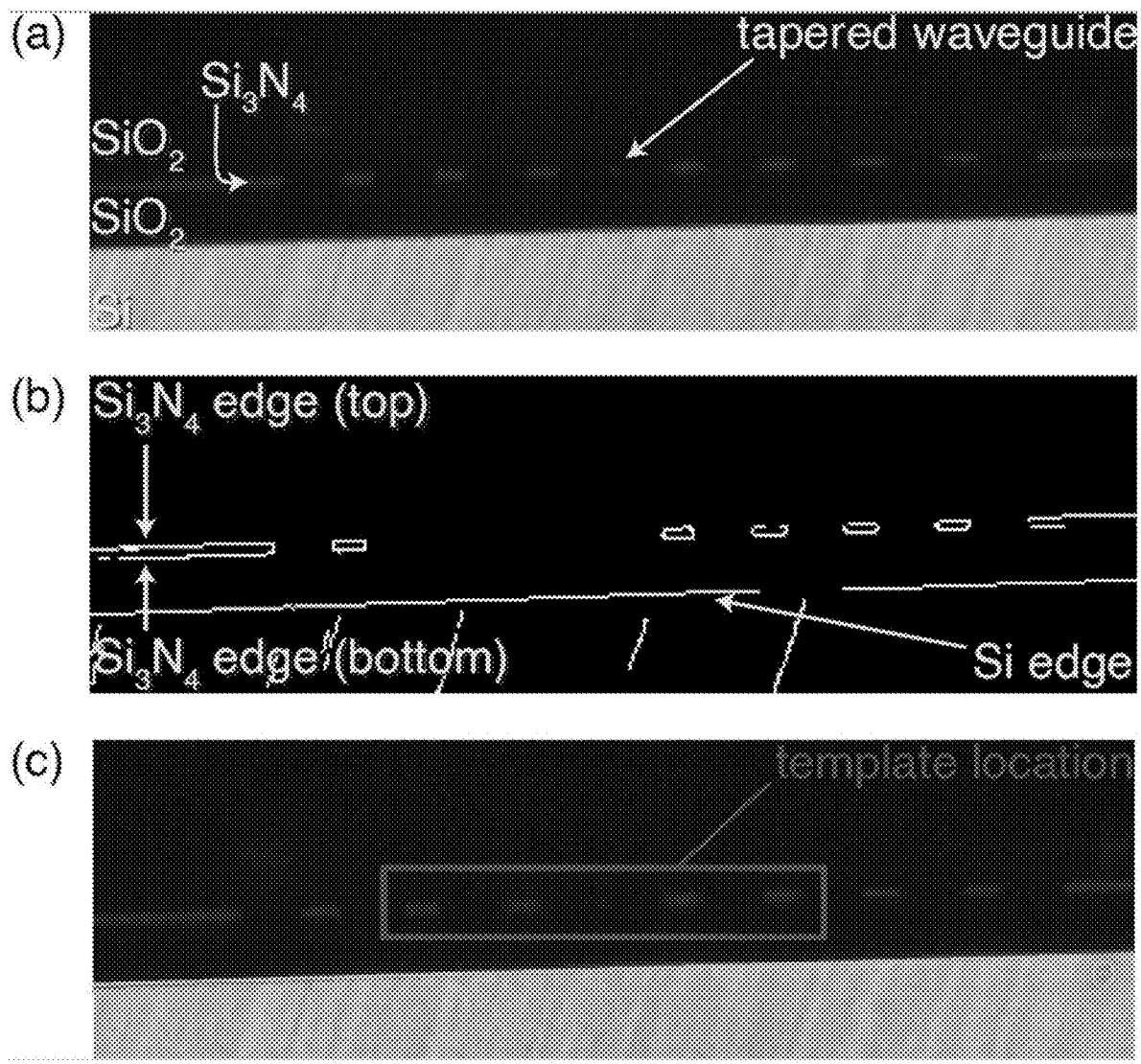
FIG. 7 shows machine vision results with a optically visible bulk impregnated barcode to determine the center of the waveguide that are more reliably than if the optically visible bulk impregnated barcode is absent, even when subject to imaging/facet imperfections, (a) An image from a DLW system, with a optically visible bulk impregnated barcode and a tapered $Si_3N_4$ waveguide at its center. The contrast in the image is determined by the index contrast between the various materials and the illumination conditions, (b) The uninterrupted high-contrast edge between the underlying $SiO_2$ and Si layers is observed in the binary output of a Canny edge detection algorithm. A Hough transform is used to identify straight lines from Si—$SiO_2$ and $Si_3N_4$—$SiO_2$ edges in the Canny image. The detection of the Si—$SiO_2$ edge and its angle $\theta$ with respect to horizontal is overlaid on the original image in panel (c). Barcode members are read by taking a 1D line scan along the average of the top and bottom $Si_3N_4$—SiO2 edges, according to the Example.

A high-visibility barcode like that in FIG. 7(a) signals the location of a waveguide in a way that cannot be disturbed by random dust or surface impurities, given its unique signature that can be readily detected. In general, the quality of the image that the DLW system captures depends on the cleanliness of the device, the surface roughness, and the index contrast between the waveguide core material and the cladding material. We found that $Si_3N_4$ (refractive index n≈2) buried in $SiO_2$ cladding (n≈1.5) provides a sufficient index contrast for pattern localization, and we expect the image quality to improve with higher-contrast waveguides, such as Si in $SiO_2$.

Figure 8:
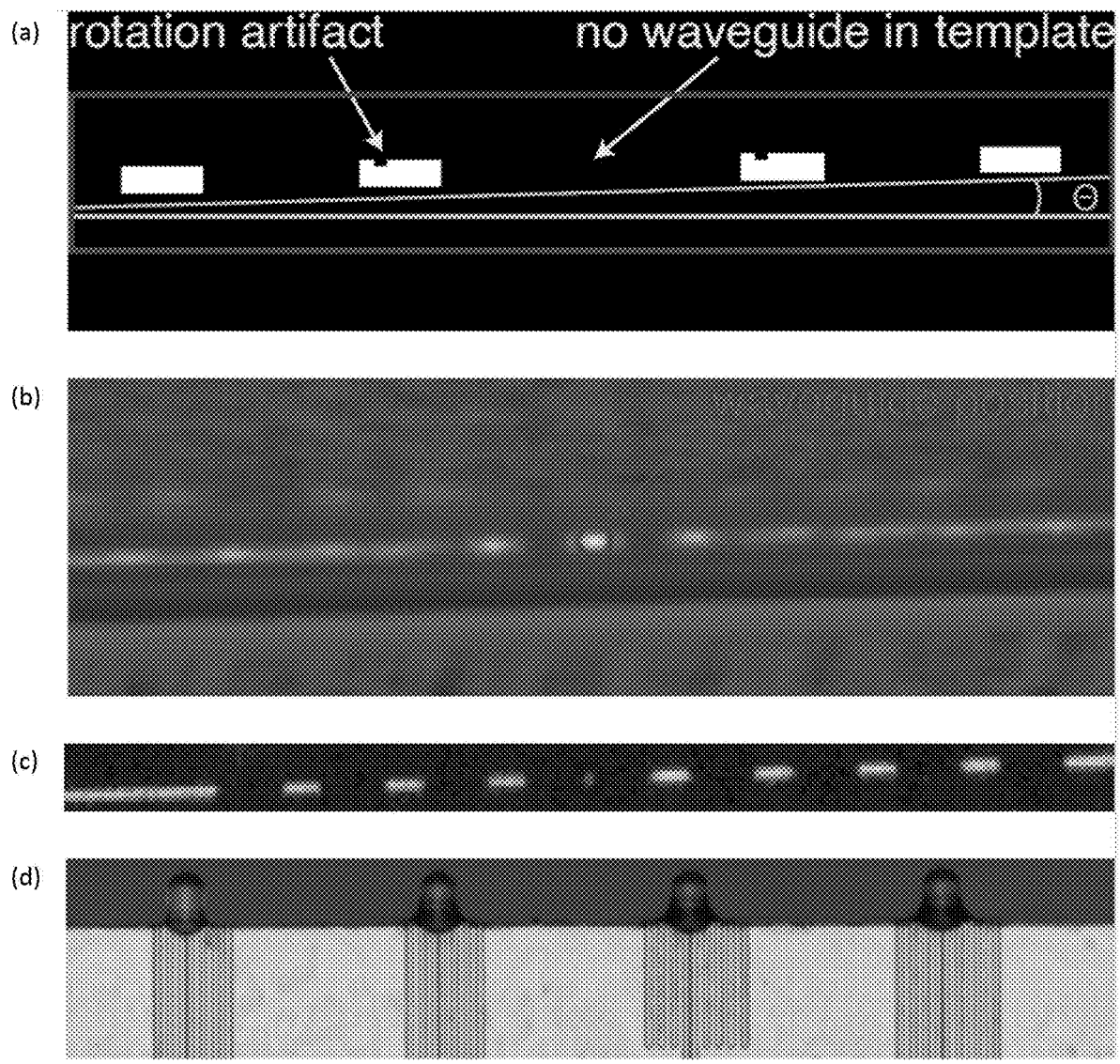
FIG. 8 shows the rectangle in (c, FIG. 7) that identifies a region of interest that will be further processed using a pre-generated binary template (a) that matches the region (the tapered waveguide itself is omitted from the template, since its presence in the original image is not assured, e.g., if imaging conditions are poor). The template is rotated by the same angle $\theta$ extracted from the Si—$SiO_2$ line. A sub-pixel peak search in the cross correlation (b) between the original image (a, FIG. 7) and the adjusted binary pattern (a) determines the center of the waveguide (circle in (b)). The final output of the process (c) determines the location of the waveguide (circle), but neither the edge detection nor the cross correlation assume the presence of a waveguide signal, only a barcode signal. (d) Off-axis optical microscope image of four lenses printed on the facet of waveguides surrounded by the barcode pattern, according to the Example.

To use the barcode pattern for waveguide identification and localization, we use machine vision techniques. The machine vision processing includes a Canny filter, a Hough transform, a binary template, and a cross correlation; together, this enables alignment without coupling a visible laser through the waveguide (i.e., without active alignment). In the machine vision processing a medium-to-high contrast image like that shown in FIG. 7(a) is captured. Because of the long spatial extent of the barcode, medium contrast is sufficient, but high contrast is preferred. A Canny filter detects edges by searching for the peaks in the gradient of the 2D image. Its output (FIG. 7(b)) includes a binary map of edge points that are then used to compute the Hough transform of the image. The Hough transform identifies the location of straight lines, not just edges, in the binary map and determines their angles with respect to the horizontal axis of the image. This information is used to determine the location of the interface between the Si and $SiO_2$ layers, and its angle (θ) shown in FIG. 7(c). At this point, the information encoded in the barcode can be retrieved from a 1D line-scan of the code, whose position is determined by interpolating between the top and bottom edges of the $Si_3N_4$ device layer. The extracted angle θ is then applied to a binary template (FIG. 8(a)) so that the template and the original image overlay at the same angle. Finally, the template and the image are cross correlated (FIG. 8(b)), and a sub-pixel peak-search determines the position of the waveguide, depicted as the center of a small red circle in the figure. Neither the line-scans nor the templates assume the presence of the waveguide itself (i.e., there is no small dot at the center of the template), meaning that even in cases of low waveguide-visibility, the barcode pattern is sufficient to determine the precise location of the small (200 nm wide) tapered-down waveguide termination. FIG. 8(c) overlays the output of this algorithm (circles centered about the detected waveguide position) on the original image, and shows that the waveguide location determined by machine vision is consistent with the position one could derive directly if they had a high-visibility image of the waveguide at the facet. Application of this localization algorithm to adjacent waveguides (with a micro-lens printing step after each localization) results in the array of devices shown in FIG. 8(d).

Exemplary Configuration.

Figure 9:
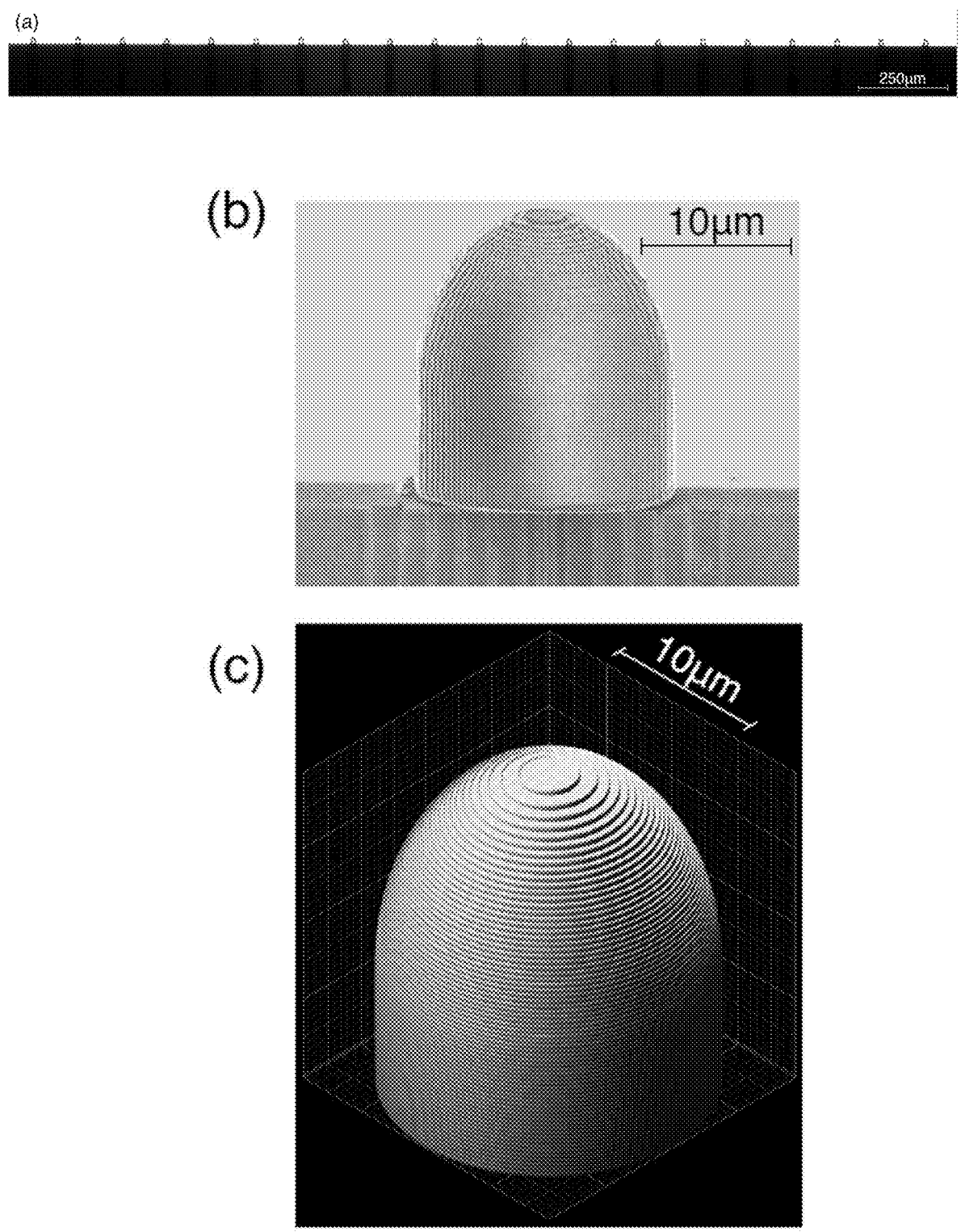
FIG. 9 shows results from an on-axis method for arrays of micro-optic structures well-aligned to on-chip waveguides that are printed with high yield. Elliptical lenses were printed at the input facet of photonic chips with an optical microscope image of twenty-one such lenses shown in (a). A scanning electron microscope image of one representative lens is shown in (b) with the location of a $Si_3N_4$ IO waveguide in the plane of the chip, wherein the $Si_3N_4$ is located underneath 3 μm of $SiO_2$, and the lens is disposed on the chip. The nominal design of the lens is shown in (c), according to the Example.

Machine vision processing was implemented in the Python programming language using NumPy and scikit-image libraries. Different Python packages or other programming languages can provide different performance. The localization technique takes about two minutes to detect each waveguide. The printing process is executed on a port-by-port basis, meaning that a port is detected, aligned to, and printed on before the next port is analyzed. The machine vision processing can be applied successively to check for errors, since a second execution should determine that no more adjustments in position are needed. Visual inspection revealed that the algorithm was able to successfully locate, align to, and print lenses on 42 out of 42 IO waveguides, on a single chip, from the on-axis perspective (100% fabrication yield). Twenty-one of these lenses are shown in FIG. 9(a). After localization, each lens took approximately 20 seconds to polymerize from IP-Dip photoresist. About half of the write time was occupied by the auto focus procedure of the DLW system, The geometric accuracy of the lenses was verified using scanning electron microscope imaging (SEM). A representative SEM image of one of the lenses is shown in FIG. 9(b). Note that the lens is well-aligned to the IO waveguide. For comparison, the model of our design is illustrated in FIG. 9(c). From these figures it is evident that the produced lens closely resembles the model.

The accuracy of the alignment is limited by the mechanical stability and imaging resolution of the DLW system. For example, repeatedly using the autofocus function of the DLW system returned slightly different values for the focal point, and leaving the system alone for periods of several minutes caused the mechanical stages to drift. Since the micro-optic structures in this study printed in 20 seconds or less, the errors due to the slow drift can be neglected. As DLW systems become increasingly sophisticated, we expect these errors to shrink. Depending on the application, it may also be possible to design micro-optics that are tolerant to miscalculation of the focal plane.

On a second chip, ten waveguides were selected, with no particular pre-screening, to verify that the on-axis printing method was not introducing unexpected errors in either the DLW process or the micro-optics themselves. Lenses that decrease the sensitivity of fiber-to-chip coupling to fiber misalignment were chosen to benchmark the fidelity of our on-axis machine-aligned DLW process. The coupling efficiency into each waveguide and its sensitivity to misalignment was measured using the set-up shown in FIG. 10(a), where a 1550 nm (polarization maintaining) fiber-coupled laser was coupled into the on-chip waveguides using the three methods highlighted in FIG. 10(b). The lensed fiber method can be used in an end-fire technique due to its ability to realize low insertion losses because of the small, focused spot size it achieves ($\approx$2.5 μm mode field diameter) and its natural compatibility with single mode optical fiber. However, it suffers from a high sensitivity to misalignment because of the small size of this focused spot as well as the small size of the mode at the optical waveguide facet. The cleaved fiber method increases the mode field diameter (MFD) of the input fiber (nominally to $\approx$10.5 μμm), so this method is expected to have a greater misalignment tolerance but also greater insertion losses due to the mode-size mismatch between the fiber and the on-chip waveguide. The micro-optic method attempts to bridge these extremes by using an ellipsoidal lens as an intermediary mode-size converter. In effect, this transfers the mode overlap problem from fiber-to-chip to micro-optic-to-chip, with the latter benefiting from the high positioning resolution of the DLW system and the permanent adhesion of the micro-optic to the chip.

Figure 10:
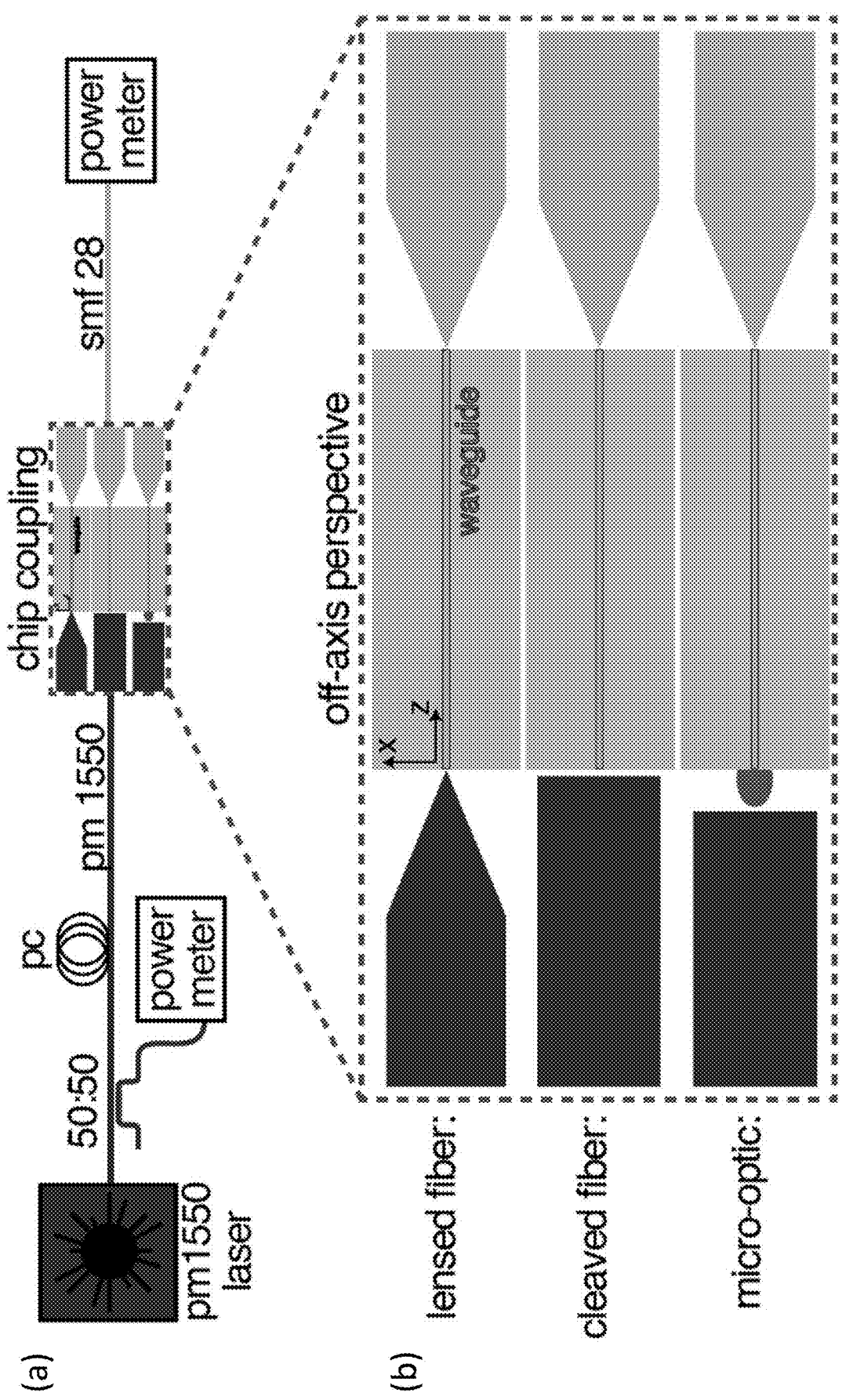
FIG. 10 shows a fiber-to-chip coupling performance of lenses as characterized with the configuration shown in (a), wherein a 1550 nm fiber-coupled laser with polarization control (pc) is optimally-coupled to the chip via one of three fiber-based methods: lensed fibers, cleaved fibers, and cleaved fibers with micro-optics on the facet of the chip (referred to as "micro-optic method"). A zoom-in of the coupling section for the three methods is shown in panel (b). The output is collected through a lensed SMF-28e fiber in each case. Once optimally coupled, the insertion losses are measured, and the coupling sensitivity to misalignment is assessed by displacing the input fiber in the x and y directions to create excess-loss profiles. For TE polarization, the electric field points along the x-axis, pm=polarization-maintaining, according to the Example.

Each of the ten waveguides was tested with the three coupling methods in both the TE and TM polarizations, where TE (TM) polarization is defined as having the electric field pointed along the x (y) axis of the device facet, based on the coordinate system shown in FIG. 5(b) and FIG. 10. Measurements included two-dimensional excess-loss profiles created by displacing the input fiber along the x and y directions in steps of dx and dy.

The micro-optic structures selected for this examination were ellipsoidal lenses with minor radii of 9.3 μm and focal lengths of 20 μm, $Si_3N_4$ waveguides were 550 nm thick, tapered down to a 200 nm width at the chip facet, and had a nominal mode field diameter of 2.5 μμm. The facets were created by dicing and polishing with a nominal surface roughness of 100 nm. Away from the facet, the waveguides are 1 μμm wide to reduce propagation losses.

Figure 11:
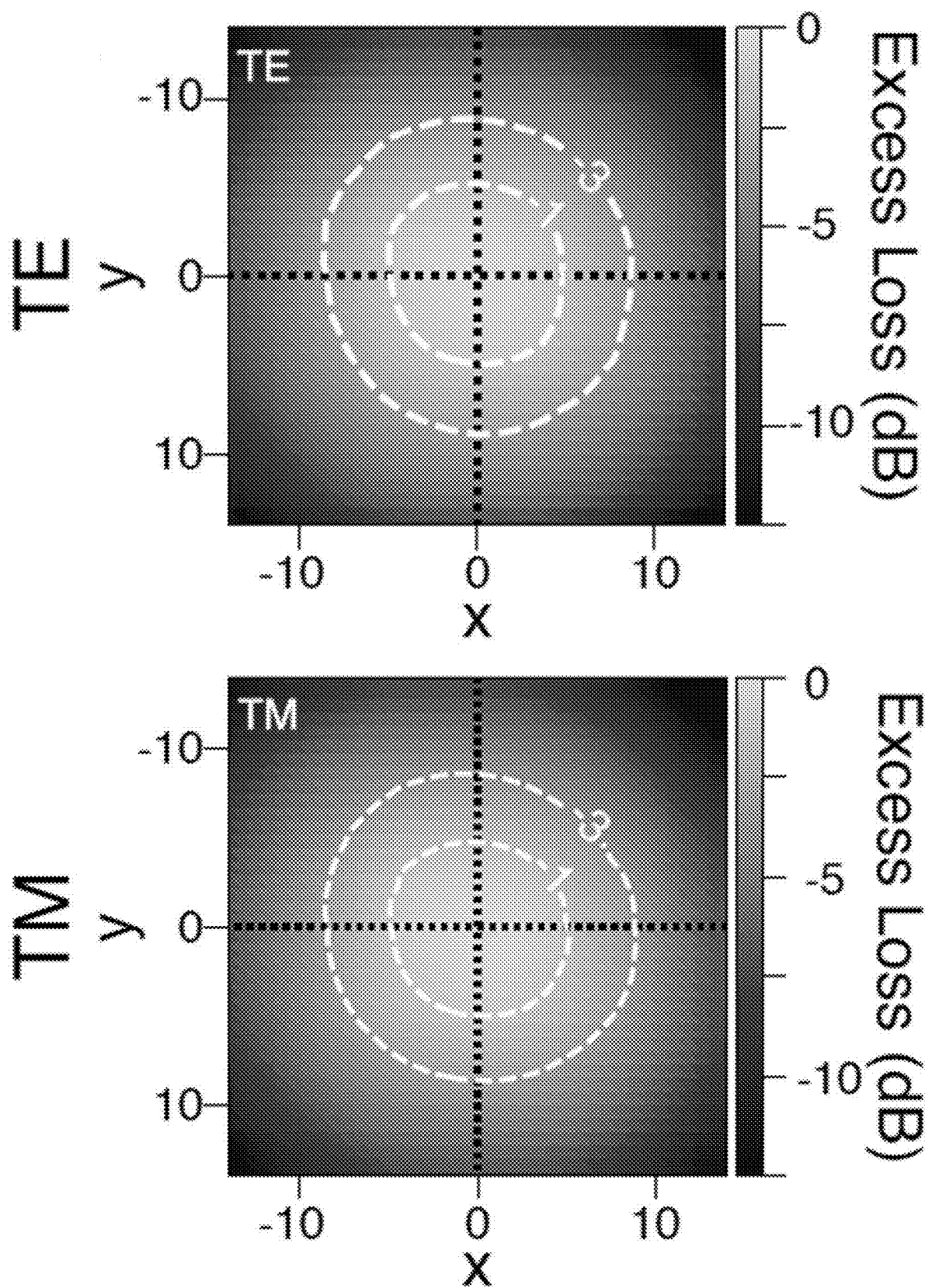
FIG. 11 shows misalignment tolerance and insertion loss of the micro-optic coupling approach as measured and compared against other end-fire coupling options. Two-dimensional maps of the excess losses were generated for each of the three cases shown in FIG. 9(c), with each case averaged across 10 waveguides, according to the Example.
Figure 13:
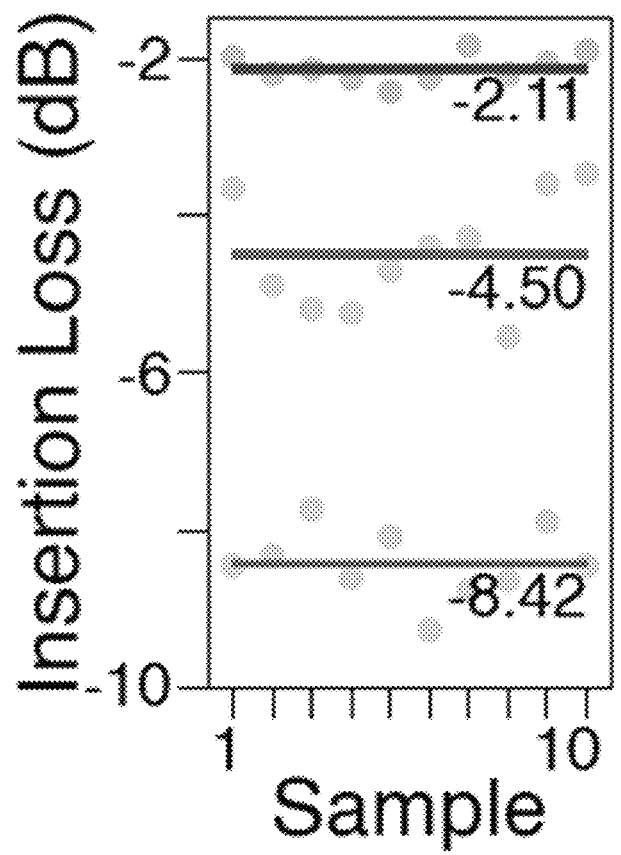
FIG. 13 shows measurement results from per-facet insertion losses, wherein the micro-optic method has on average ≈2 dB more loss than lensed fibers, according to the Example.
Figure 13:
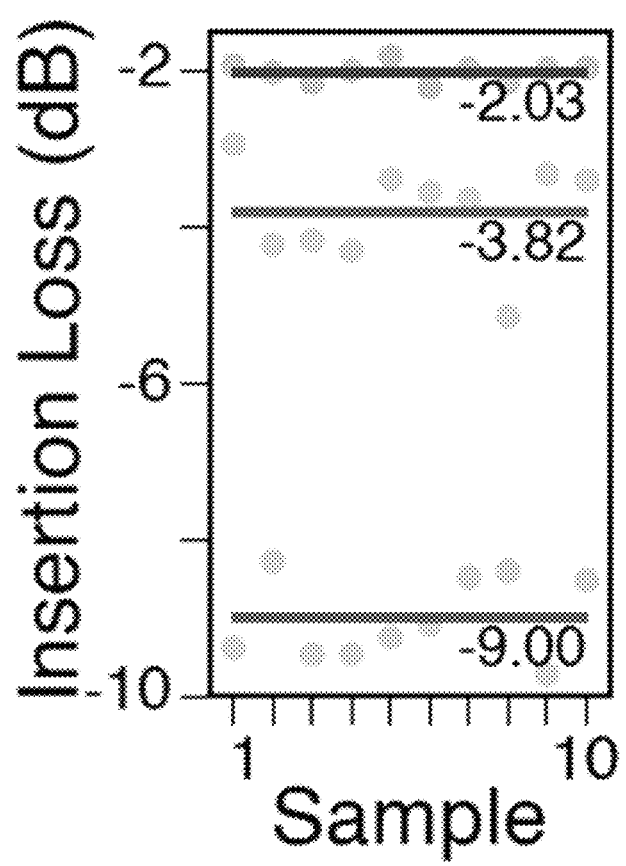

FIG. 11 shows the excess loss profiles for the TE and TM polarizations (averaged across all ten waveguides) of the micro-optic coupling method with displacement steps dx=dy=0.5 μμm. The dashed white lines in the figure correspond to the $-1$ dB and $-3$ dB contours, which are smooth and circular as expected due to the axial symmetry of elliptical lenses. The excess loss profiles are normalized with respect to the averaged peak efficiency of the coupling method, the explicit values of which are listed in the scatter plots of FIG. 13.

Figure 12:
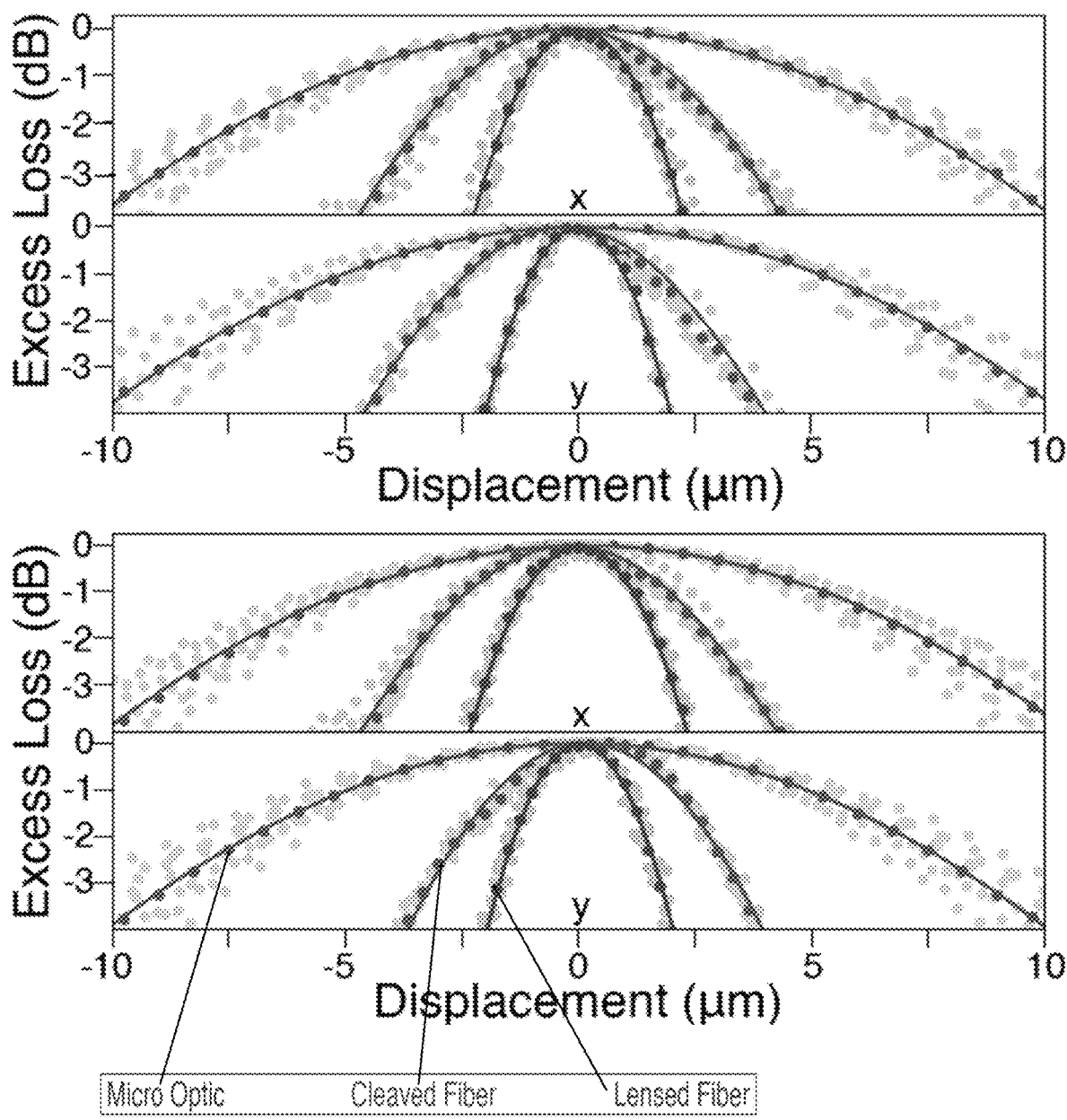
FIG. 12 shows excess loss maps (TE and TM polarizations) for the case of the micro-optic show smooth, circular profiles, as expected from axially-symmetric lenses. White dashed lines on the maps indicate the −1 dB and −3 dB contours, and black dashed lines indicate the location of x and y line-scans used to compare the three coupling techniques. The top (bottom) two line scan plots correspond to data from the TE (TM) polarization, in which the electric field points in the x (y) direction. Light-colored markers indicate data from the ten waveguides, dark-colored markers correspond to averages of the data, and dark-colored lines correspond to Gaussian fits of the averaged data. These line-scans show that the micro-optic approach has the greatest misalignment tolerance, according to the Example.

To compare the three coupling techniques, FIG. 12 shows line-scans along the x and y axes for each configuration. In this image the light-colored markers correspond to the data from the ten waveguides, and the dark-colored markers correspond to averages of the data. The dark-colored lines correspond to Gaussian fits of the averaged data. The data show the expected trend: coupling methods that overlap large optical modes are more tolerant to displacement, and the micro-optic method (in which the fiber and lens both have large modes) has the greatest amount of displacement tolerance. This trend is quantified in FIG. 14, where the $-1$ dB and $-3$ dB diameters are reported. The uncertainty in these measurements is the standard deviation of the diameters about their average, and the leading source of measurement error is laser power fluctuations while the leading source of variation from waveguide to waveguide is likely the lens quality.

The insertion loss (FIG. 13) for each coupling technique was measured for each of the ten waveguides in both polarizations, where we have assumed that all losses are due to facet coupling. From initial calculations, we expected the micro-optic method to perform on par with the lensed fiber method, but the micro-optics introduced an insertion loss penalty as small as $\approx$1 dB and $\approx$2 dB on average. 3D FDTD simulations show that errors in the micro-optic placement would need to be at the 1 μμm level (far greater than the maximum placement error we observe experimentally (e.g., FIG. 9(b)) to account for the discrepancy between measured and simulated insertion losses. We believe that the added loss is likely due to imperfections in the lens fabrication, resulting from an un-optimized lithography process. For the specific DLW system we use, a transition from the current fast printing mode to a slower printing mode is expected to come with an improvement in micro-optic surface quality.

Figure 15:
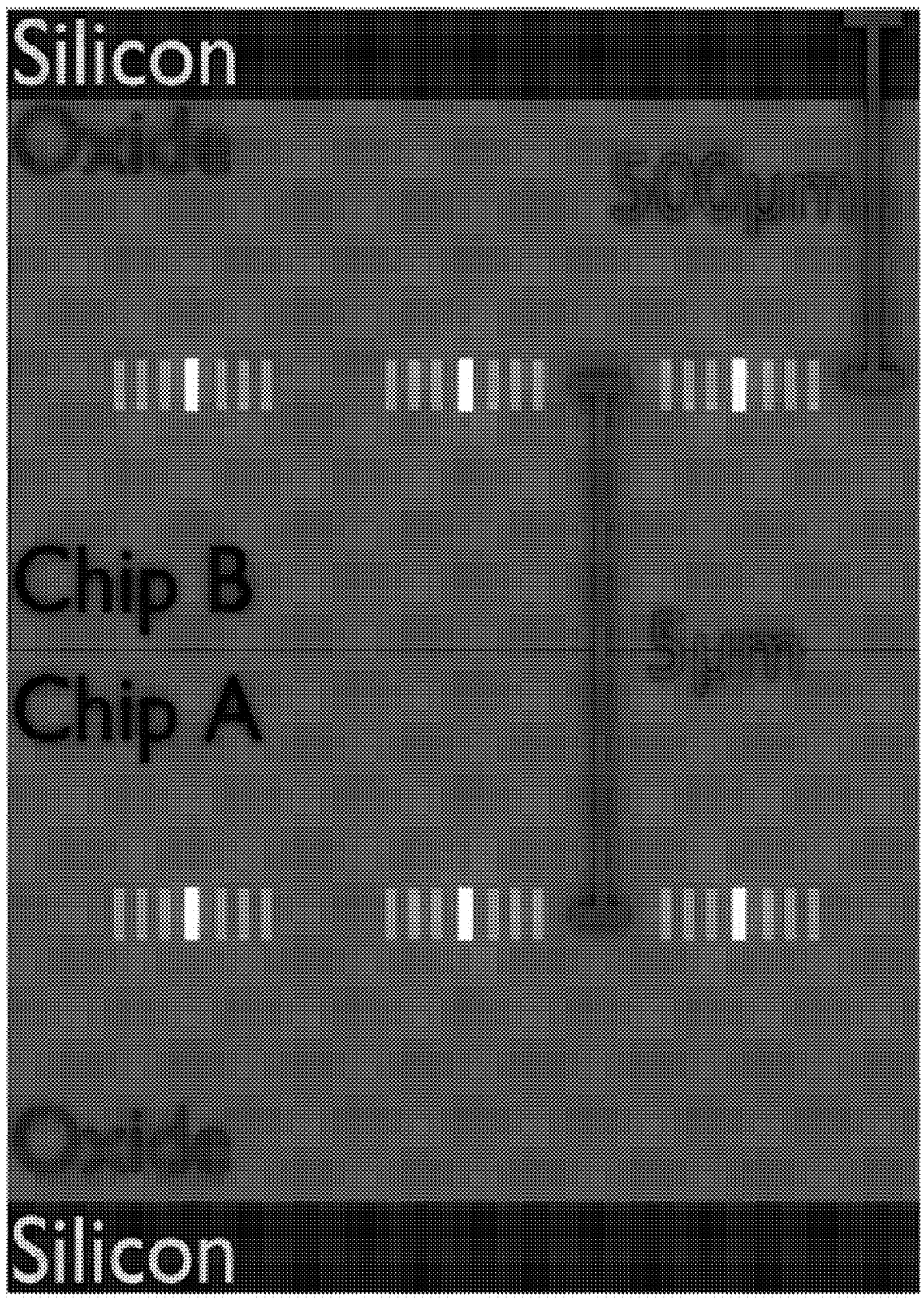
FIG. 15 shows on-axis direct laser writing provides novel chip-to-chip interconnects for stacking two photonic chips. Printing at the edge of this system would be challenging in the off-axis orientation because the top Si substrate is highly absorbing at the wavelength of a 780 nm wavelength lithography beam and is thicker than the working distance of the objective, according to the Example.

The on-axis printing of barcode-guided direct laser writing reads barcode patterns and aligns to waveguides from the on-axis perspective for configurations in chip-to-chip interconnects. While photonic wire bonding has achieved great success in realizing low loss interconnection between laterally adjacent photonic chips, the lateral footprint can be limited, and stacks of chips can be made. For the stack of two chips shown in FIG. 15, Chip B is identical to Chip A (besides its upside down orientation), but this need not be the case. Instead, the chips could be composed of completely different layer stacks. Such chip stacking might be useful for increasing the density of photonic devices or for combining the properties of otherwise incompatible materials. One possible solution would be to make a chip-to-chip interconnect that utilizes the barcode patterns in each chip (FIG. 15)

to link a specific waveguide in Chip A to a specific waveguide in Chip B. Since the methodology that we have developed above is suitable for such an endeavor, we fabricated a proof-of-concept interconnect (FIG. 16) that connects a $Si_3N_4$ IO port from one of the chips to that in the other. In this case, the chips were bonded to each other using SU-8 photoresist, and the two-chip stack was transferred to the DLW system as a pre-assembled unit. Since the interconnect was fabricated using on-axis lithography, no significant modifications to the methods outlined in the previous sections were needed. The design of the interconnect shown FIG. 15 may not be suitable for low loss interconnection but was designed so that all of the features of the 2-chip stack could be captured in one image. The bending radius can be increased by laterally displacing the waveguides to be connected, or adding a thick layer of photoresist between the two chips. With these practical concerns related to loss addressed, the interconnect can then be designed to control for properties like polarization and mode shape. Such a stack of chips would be hard to address through off-axis DLW because the distance between the waveguide layers and the top surface (>500 μm, exceeding the objective working distance) as well as the absorption of the lithography beam by the top silicon substrate can be significant obstacles.

On-axis DLW via barcode-guided direct laser writing overcomes technical deficiencies and issues with printing of micro-optics on chip facets, including beam obstruction (the shadowing effect) and material incompatibilities. To enable high-accuracy localization of the waveguide ports, barcode-guided direct laser writing uses a optically transparent direct laser writing substrate 201 with optically visible bulk impregnated barcode 203 (in the device layer) that can be read from the on-axis perspective from facet surface 204. The optically visible bulk impregnated barcode 203 was read and aligned-to using image processing tools. We printed an array of elliptical lenses that improve fiber-to-chip misalignment tolerance and fabricated a concept 3-dimensional photonic wire bond to bridge optical ports on vertically stacked chips, which might be incompatible with off-axis DLW.

Fabrication

The lenses were printed with a DLW system configured with a 63× objective with a 1.4 numerical aperture. The system was operated in the dip-in laser lithography (DiLL) mode to print on the facet of the chip, and only reflective illumination was used. The system uses a 780 nm femtosecond laser as its source, which is rastered with a speed of 10 mm/s, repetition rate of 80 MHz, and with an average power of 20 mW entering the aperture of the objective. The raster distances between subsequent lines and between subsequent layers were set to 200 nm and 300 nm respectively. The system was operated locally (i.e., not in server mode) although server mode could be used as well.

IP-Dip was the photoresist used in this study, due to its physical and optical properties being known. Losses might 0.78 dB/mm at 1550 nm through IP-Dip. Length of our lenses was approximately 20 μμm, corresponding to approximately 0.02 dB, and some losses occurred due to absorption of laser light by the resist. Lenses were made to benchmark the on-axis fabrication method, and recipe development can improve surface quality.

To hold the samples in the correct orientation for on-axis DLW, a sample mount was made. The mount was a rectangular sheet with a cutout near its middle at a default location of the objective. Approximately 6 mm long chips were disposed against walls of this cutout with the bottom portion of the chip in contact with the wall and held in place with a nylon-tipped setscrew.

Lens Design

The lenses were axially symmetric ellipsoids with minor diameters of 18.6 μm and focal lengths of 20 μm. An ellipsoid focuses light of a single wavelength without spherical aberrations. To increase adhesion between the lens and the surface of the photonic chip, the bottom half of the ellipse was embedded in a cylinder of the same radius, This ellipse-with-cylindrical-base geometry is what gives the lenses in FIG. 9(b) and FIG. 9(c) a bullet-like shape. The equation for the curve of the ellipsoid is $$\rho(z) = \sqrt{(r/\beta - \gamma z)^2 - (r/\beta - z)^2}$$

wherein r=9.3 μm is the design's minor radius; z is the distance away from the apex of the ellipse in microns, $\gamma = n_{air}/n_{resist}$, $\gamma = n_{air}/n_{resist}$, $n_{air} = 1.00029$ $n_{air} = 1.00029$ is the index of refraction of air, $\gamma = n_{air}/n_{resist} = 1.48922$ is the index of refraction of IP-Dip as calculated from Cauchy coefficients, and $\beta = 0.443166$ is a constant defined by $$\beta = \sqrt{(1-\gamma)/(1+\gamma)}.$$

Using r as a free parameter, 3D FDTD simulations optimized r for the 200 nm width inverse tapers at the IO facet of our chips.

The processes described herein may be embodied in, and fully automated via, software code modules executed by a computing system that includes one or more general purpose computers or processors. The code modules may be stored in any type of non-transitory computer-readable medium or other computer storage device. Some or all the methods may alternatively be embodied in specialized computer hardware. In addition, the components referred to herein may be implemented in hardware, software, firmware, or a combination thereof.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

Any logical blocks, modules, and algorithm elements described or used in connection with the embodiments disclosed herein can be implemented as electronic hardware, computer software, or combinations of both. To clearly illustrate this interchangeability of hardware and software, various illustrative components, blocks, modules, and elements have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described or used in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, or algorithm described in connection with the embodiments disclosed herein can be embodied directly in hardware, in a software module stored in one or more memory devices and executed by one or more processors, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A barcoded end facet printed photonic chip comprising:
   an optically transparent direct laser writing substrate comprising a transverse waveguide writing surface to receive a direct write laser light for off-axis direct write laser printing and a facet surface to receive the direct write laser light for on-axis direct write laser printing of a barcode-guided direct laser written optical coupling on the facet surface;
   a waveguide disposed in the optically transparent direct laser writing substrate and in optical communication with the facet surface; and
   an optically visible bulk impregnated barcode disposed in the optically transparent direct laser writing substrate arranged proximate to the waveguide and in optical communication with the facet surface.

2. The barcoded end facet printed photonic chip of claim 1, further comprising the barcode-guided direct laser written optical coupling disposed on the facet surface in response to on-axis direct write laser printing by direct write laser light.

3. The barcoded end facet printed photonic chip of claim 2, wherein the barcode-guided direct laser written optical coupling comprises a lens for receiving a laser light and optically coupling the laser light into or out of the waveguide.

4. The barcoded end facet printed photonic chip of claim 2, wherein the optically transparent direct laser writing substrate receives the direct write laser light, forms three-dimensional optical structures in the optically transparent direct laser writing substrate in response to receiving the direct write laser light, and forms integrated photonic chips comprising the three-dimensional optical structures.

5. The barcoded end facet printed photonic chip of claim 1, wherein the optically visible bulk impregnated barcode comprises a plurality of barcode members.

6. The barcoded end facet printed photonic chip of claim 5, wherein the barcode members are distributed laterally with respect to the waveguide as observed from the facet surface.

7. The barcoded end facet printed photonic chip of claim 1, wherein the optically transparent direct laser writing substrate comprises a polymer, glass, or a combination comprising polymer and glass.

8. The barcoded end facet printed photonic chip of claim 1, wherein the facet surface is arranged at an oblique angle to the transverse waveguide writing surface.

9. A barcode-guided direct laser writer for barcode-guided direct laser writing of an optically transparent direct laser writing substrate, the barcode-guided direct laser writer comprising:
  a translation stage that receives an optically transparent direct laser writing substrate in an off-axis printing orientation or an on-axis printing orientation with respect to a direct write laser;
  a direct write laser in optical communication with the optically transparent direct laser writing substrate and that produces direct write laser light;
  an optical objective in optical communication with the optically transparent direct laser writing substrate and that receives an image of the optically transparent direct laser writing substrate;
  a light sensor in optical communication with the optically transparent direct laser writing substrate via the optical objective and that receives the image from the optical objective and produces image data from the image;
  an analyzer in electrical communication with the direct write laser, the light sensor, and the translation stage and that:
    controls the direct write laser so that the direct write laser produces the direct write laser light under the control of the analyzer;
    receives the image data from the light sensor and controls the direct write laser and the translation stage based on the image data;
    determines a position of a waveguide in the optically transparent direct laser writing substrate relative to an optically visible bulk impregnated barcode disposed in the optically transparent direct laser writing substrate; and
    controls the translation stage so that the translation stage positions the optically transparent direct laser writing substrate relative to the direct write laser under control of the analyzer to make a barcode-guided direct laser written optical coupling on a facet surface of the optically transparent direct laser writing substrate to form a barcoded end facet printed photonic chip from the optically transparent direct laser writing substrate via barcode-guided direct laser writing,
  wherein the optically transparent direct laser writing substrate forms a barcode-guided direct laser written optical coupling in response to receipt of the direct write laser light from the direct write laser at the facet surface, and
  the optically transparent direct laser writing substrate comprises:
    a transverse waveguide writing surface that receives the direct write laser light when disposed on the translation stage for off-axis direct write laser printing and the facet surface that receives the direct write laser light when disposed on the translation stage for on-axis direct write laser printing of the barcode-guided direct laser written optical coupling on the facet surface;
    a waveguide disposed in the optically transparent direct laser writing substrate and in optical communication with the facet surface; and
    the optically visible bulk impregnated barcode disposed in the optically transparent direct laser writing substrate arranged proximate to the waveguide and in optical communication with the facet surface.

10. The barcode-guided direct laser writer of claim 9, wherein the analyzer comprises:
  a laser controller in communication with the direct write laser and in communication with a processor and that receives laser data from the processor and produces a direct write control signal that is communicated from the laser controller to the direct write laser, such that the direct write laser produces the direct write laser light under control of the direct write control signal;
  an imaging controller in communication with the light sensor and in communication with the processor and that receives the image data from the light sensor and communicates the image data to the processor; and
  a laser-substrate position controller in communication with the translation stage and in communication with the processor and that receives a position control signal from the processor and produces a position control signal that is communicated from the laser-substrate position controller to the translation stage, such that the translation stage moves the optically transparent direct laser writing substrate relative to the direct write laser light under control of the position control signal.

11. The barcode-guided direct laser writer of claim 9, wherein the optically visible bulk impregnated barcode comprises a plurality of barcode members.

12. The barcode-guided direct laser writer of claim 11, wherein the barcode members are distributed laterally with respect to the waveguide as observed from the facet surface.

13. The barcode-guided direct laser writer of claim 9, wherein the barcode-guided direct laser written optical coupling comprises a lens for receiving a laser light and optically coupling the laser light into or out of the waveguide.

14. The barcode-guided direct laser writer of claim 9, wherein the optically transparent direct laser writing substrate receives the direct write laser light from the direct write laser, forms three-dimensional optical structures in the optically transparent direct laser writing substrate in response to receiving the direct write laser light, and forms integrated photonic chips comprising the three-dimensional optical structures.

15. The barcode-guided direct laser writer of claim 9, wherein the facet surface is arranged at an oblique angle to the transverse waveguide writing surface.

16. A process for barcode-guided direct laser writing of an optically transparent direct laser writing substrate, the process comprising:
  receiving an optically transparent direct laser writing substrate on a translation stage so that a facet surface of the optically transparent direct laser writing substrate is in optical communication with a direct write laser, the optically transparent direct laser writing substrate comprises:
    a transverse waveguide writing surface that receives direct write laser light when disposed on the translation stage for off-axis direct write laser printing and the facet surface that receives the direct write laser light when disposed on the translation stage for on-axis direct write laser printing of the barcode-guided direct laser written optical coupling on the facet surface;
a waveguide disposed in the optically transparent direct laser writing substrate and in optical communication with the facet surface; and
an optically visible bulk impregnated barcode disposed in the optically transparent direct laser writing substrate and arranged proximate to the waveguide and in optical communication with the facet surface;
producing direct write laser light by the direct write laser;
acquiring an image of the facet surface with the optically visible bulk impregnated barcode and the waveguide observable in the image;
analyzing the image to determine the position of the waveguide relative to the optically visible bulk impregnated barcode;
positioning the optically transparent direct laser writing substrate relative to the direct write laser light from the direct write laser so that the direct write laser light is received at the facet surface on-axis at a position corresponding to the waveguide in the optically transparent direct laser writing substrate; and
forming, in response to receiving the direct write laser at the facet surface, a barcode-guided direct laser written optical coupling on the facet surface on-axis at the position corresponding to the waveguide in the optically transparent direct laser writing substrate to form a barcoded end facet printed photonic chip from the optically transparent direct laser writing substrate.

17. The process of claim 16, wherein analyzing the image to determine the position of the waveguide relative to the optically visible bulk impregnated barcode comprises:
controlling the direct write laser so that the direct write laser produces the direct write laser light under the control of a direct write control signal;
controlling the direct write laser and the translation stage based on image of the optically transparent direct laser writing substrate;
determining a position of the waveguide in the optically transparent direct laser writing substrate relative to the optically visible bulk impregnated barcode disposed in the optically transparent direct laser writing substrate; and
controlling the translation stage so that the translation stage positions the optically transparent direct laser writing substrate relative to the direct write laser to make the barcode-guided direct laser written optical coupling on the facet surface of the optically transparent direct laser writing substrate to form the barcoded end facet printed photonic chip from the optically transparent direct laser writing substrate.

18. The process of claim 17, further comprising:
receiving, by a laser controller of an analyzer that is in communication with the direct write laser and a processor of an analyzer, laser data from the processor;
producing, by the laser controller, a direct write control signal;
communicating, from the laser controller to the direct write laser, the direct write laser;
producing, by the direct write laser light, the direct write laser light under control of the direct write control signal;
receiving, by an imaging controller of the analyzer that is in communication with a light sensor that acquires the image and in communication with the processor; the image data from the light sensor;
communicating the image data from the imaging controller to the processor; and
receiving, by a laser-substrate position controller of the analyzer in communication with the translation stage and in communication with the processor, a position control signal from the processor;
producing, by the laser-substrate position controller, a position control signal and communicating the position control signal from the laser-substrate position controller to the translation stage; and
moving, by the translation stage, the optically transparent direct laser writing substrate relative to the direct write laser light under control of the position control signal.

19. The process of claim 16, wherein the optically visible bulk impregnated barcode comprises a plurality of barcode members that are distributed laterally with respect to the waveguide as observed from the facet surface.

20. The process of claim 16, further comprising receiving, by the optically transparent direct laser writing substrate, the direct write laser light from the direct write laser, forming three-dimensional optical structures in the optically transparent direct laser writing substrate in response to receiving the direct write laser light, and forming integrated photonic chips comprising the three-dimensional optical structures,
wherein the barcode-guided direct laser written optical coupling comprises a lens for receiving a laser light and optically coupling the laser light into or out of the waveguide.

* * * * *